(12) United States Patent
Lu et al.

(10) Patent No.: US 11,753,741 B2
(45) Date of Patent: Sep. 12, 2023

(54) NITROGEN DOPED AND VACANCY DOMINATED SILICON INGOT AND THERMALLY TREATED WAFER FORMED THEREFROM HAVING RADIALLY UNIFORMLY DISTRIBUTED OXYGEN PRECIPITATION DENSITY AND SIZE

(71) Applicant: GlobalWafers Co., Ltd., Hsinchu (TW)

(72) Inventors: Zheng Lu, O'Fallon, MO (US);
Gaurab Samanta, St. Peters, MO (US);
Tse-Wei Lu, Hsinchu (TW);
Feng-Chien Tsai, Taipei (TW)

(73) Assignee: GlobalWafers Co., Ltd., Hsinchu (TW)

( * ) Notice: Subject to any disclaimer, the term of this patent is extended or adjusted under 35 U.S.C. 154(b) by 211 days.

(21) Appl. No.: 17/199,645

(22) Filed: Mar. 12, 2021

(65) Prior Publication Data
US 2021/0198805 A1     Jul. 1, 2021

Related U.S. Application Data

(60) Continuation of application No. 15/983,455, filed on May 18, 2018, now Pat. No. 10,988,859, which is a
(Continued)

(51) Int. Cl.
*C30B 29/02*     (2006.01)
*C30B 33/02*     (2006.01)
(Continued)

(52) U.S. Cl.
CPC ............ *C30B 33/02* (2013.01); *C30B 15/203* (2013.01); *C30B 15/206* (2013.01); *C30B 29/06* (2013.01);
(Continued)

(58) Field of Classification Search
CPC ...... C30B 29/06; C30B 15/203; C30B 15/206
See application file for complete search history.

(56) References Cited

U.S. PATENT DOCUMENTS

| 5,779,791 A | 7/1998 | Korb et al. |
| 5,954,873 A * | 9/1999 | Hourai ................. C30B 15/203 |
| | | 117/932 |

(Continued)

FOREIGN PATENT DOCUMENTS

| JP | 2009269779 A | 11/2009 |
| JP | 201064953 A | 3/2010 |

(Continued)

OTHER PUBLICATIONS

Loix et al., Optimization of Silicon Ingot Quality by the Numerical Prediction of Bulk Crystal Defects, 2010, vols. 156-158; pp. 205-201.

(Continued)

*Primary Examiner* — Matthew J Song
(74) *Attorney, Agent, or Firm* — Armstrong Teasdale LLP

(57) ABSTRACT

Nitrogen-doped CZ silicon crystal ingots and wafers sliced therefrom are disclosed that provide for post epitaxial thermally treated wafers having oxygen precipitate density and size that are substantially uniformly distributed radially and exhibit the lack of a significant edge effect. Methods for producing such CZ silicon crystal ingots are also provided by controlling the pull rate from molten silicon, the temperature gradient and the nitrogen concentration. Methods for simulating the radial bulk micro defect size distribution, radial bulk micro defect density distribution and oxygen precipitation density distribution of post epitaxial thermally treated wafers sliced from nitrogen-doped CZ silicon crystals are also provided.

10 Claims, 23 Drawing Sheets

Related U.S. Application Data division of application No. 14/812,744, filed on Jul. 29, 2015, now Pat. No. 11,111,602.

(60) Provisional application No. 62/031,203, filed on Jul. 31, 2014.

(51) Int. Cl.
  *C30B 29/06* (2006.01)
  *H01L 21/02* (2006.01)
  *H01L 21/00* (2006.01)
  *C30B 15/20* (2006.01)

(52) U.S. Cl.
  CPC .......... *H01L 21/00* (2013.01); *H01L 21/0262* (2013.01); *H01L 21/02381* (2013.01); *H01L 21/02532* (2013.01)

(56) References Cited

U.S. PATENT DOCUMENTS

| | | | |
|---|---|---|---|
| 6,197,109 B1 * | 3/2001 | Iida | ................ C30B 15/203 117/19 |
| 6,387,466 B1 | 5/2002 | Fusegawa et al. | |
| 6,808,781 B2 | 10/2004 | Mule'Stagno et al. | |
| 7,147,711 B2 | 12/2006 | Tamatsuka et al. | |
| 7,201,800 B2 | 4/2007 | Mule'Stagno et al. | |
| 7,208,043 B2 | 4/2007 | Tachikawa et al. | |
| 7,875,117 B2 | 1/2011 | Nakamura et al. | |
| 8,216,362 B2 | 7/2012 | Kulkarni | |
| 8,673,248 B2 | 3/2014 | Kulkarni | |
| 2004/0009111 A1 | 1/2004 | Haga et al. | |
| 2005/0020728 A1 | 1/2005 | Nagaswa et al. | |
| 2006/0189169 A1 | 8/2006 | Adachi et al. | |
| 2006/0283376 A1 | 12/2006 | Sugimura et al. | |
| 2008/0096371 A1 | 4/2008 | Von Ammon et al. | |
| 2009/0004426 A1 | 1/2009 | Falster et al. | |
| 2009/0226737 A1 | 9/2009 | Kurita et al. | |
| 2010/0059861 A1 | 3/2010 | Mueller et al. | |
| 2010/0164071 A1 * | 7/2010 | Nakai | ................ C30B 15/00 257/617 |
| 2011/0250739 A1 | 10/2011 | Falster et al. | |
| 2015/0044422 A1 | 2/2015 | Araki et al. | |

FOREIGN PATENT DOCUMENTS

| | | |
|---|---|---|
| JP | 2010168267 A | 8/2010 |
| JP | 2013147407 A | 8/2013 |
| WO | 9845507 A1 | 10/1998 |
| WO | 9845509 A1 | 10/1998 |
| WO | 9845510 A1 | 10/1998 |
| WO | 0200969 A1 | 1/2002 |
| WO | 2013136666 A1 | 9/2013 |

OTHER PUBLICATIONS

Kulkarni, et al., "Simplified Two-Dimensional Quantification of the Grown-in Microdefect Distributions in Czochralski Grown Silicon Crystals," Journal of the Electrochemical Society, 2005, vol. 152 (10), pp. G781 to G786.

Kulkarni, M. S., "A Selective Review of the Quantification of Defect Dynamics in Growing Czochralski Silicon Crystals," Ind. Eng. Chem. Res., 2005, vol. 44, pp. 6246-6263.

Kulkarni, M. S., "Lateral Incorporation of the Intrinsic Point Defects in Czochralski Silicon Crystals," ECS Transactions, vol. 3, No. 4, 2006, pp. 183-197.

Kulkarni, M. S., "Defect dynamics in the presence of oxygen in growing Czochralski silicon crystals," Journal of Crystal Growth, 2007, vol. 303, pp. 438-448.

Kulkarni, M., "Defect Dynamics in the presence of nitrogen in growing Czochralski silicon crystals," Journal of Crystal Growth, 2008, vol. 310, pp. 324-335.

Voronkov et al., "Nucleation of oxide precipitates in vacancy-containing silicon," Journal of Applied Physics, May 1, 2002, vol. 91, No. 9, pp. 5802-5810.

Samanta et al., "Efficient computation of population distribution of microdefects at any location in growing Czochralski silicon single crystals," Journal of Crystal Growth, 2014, vol. 393, pp. 49-53.

International Search Report and Written Opinion for Application No. PCT/US2015/042714, dated Oct. 5, 2015, 13 pgs.

Liaw, H. M. et al., "Silicon Vapor-Phase Epitaxy", Epitaxy Silicon Technology, 1986, pp. 1-90, Academic Press, Inc.

* cited by examiner

NITROGEN DOPED AND VACANCY DOMINATED SILICON INGOT AND THERMALLY TREATED WAFER FORMED THEREFROM HAVING RADIALLY UNIFORMLY DISTRIBUTED OXYGEN PRECIPITATION DENSITY AND SIZE

CROSS-REFERENCE TO RELATED APPLICATIONS

This application is a continuation of U.S. application Ser. No. 15/983,455, filed May 18, 2018, the disclosure of which is incorporated by reference as if set forth in its entirety. U.S. application Ser. No. 15/983,455 is a divisional application of U.S. application Ser. No. 14/812,744, filed on Jul. 29, 2015, the disclosure of which is incorporated by reference as if set forth in its entirety. U.S. application Ser. No. 14/812,744 claims the benefit of priority to U.S. Provisional Application Ser. No. 62/031,203, filed Jul. 31, 2014, the disclosure of which is incorporated by reference as if set forth in its entirety.

BACKGROUND

The field of the disclosure relates generally to semiconductor grade single crystal silicon which is used in the manufacture of electronic components and methods for preparation thereof. More particularly, the present disclosure relates to vacancy dominated single crystal silicon ingots and wafers sliced therefrom that are doped with nitrogen and provide for thermally treated silicon wafers having oxygen precipitate density and size that are uniformly distributed radially and exhibit the lack of a significant edge effect.

Single crystal silicon, from which a single crystal silicon wafer may be obtained, is commonly prepared by the so-called Czochralski ("CZ") method. In this method, polycrystalline silicon ("polysilicon") is charged to a crucible and melted, a seed crystal is brought into contact with the molten silicon, and a single crystal is grown by slow extraction. After formation of a neck is complete, the diameter of the crystal is enlarged by decreasing the pull rate and/or the melt temperature until the desired or target diameter is reached. The cylindrical main body of the crystal having an approximately constant diameter is then grown by controlling the pull rate and the melt temperature while compensating for the decreasing melt level. Near the end of the growth process, but before the crucible is emptied of molten silicon, the crystal diameter is typically reduced gradually to form an end-cone. Typically, the end-cone is formed by increasing the crystal pull rate and heat supplied to the crucible. When the diameter becomes small enough, the crystal is then separated from the melt.

It is recognized that a number of defects in single crystal silicon form in the crystal growth chamber as the crystal cools after solidification. Such defects arise, in part, due to the presence of an excess (i.e., a concentration above the solubility limit) of intrinsic point defects, which are known as crystal lattice vacancies ("V") and silicon self-interstitials ("I"). The type and initial concentration of the intrinsic point defects are determined at the time of solidification and, if these concentrations reach a level of critical super saturation in the system and the mobility of the point defects is sufficiently high, a reaction, or an agglomeration event, will likely occur. Agglomerated intrinsic point defects in silicon, including bulk micro defects ("BMD") such as oxygen precipitates, can impact the yield potential of the material in the production of complex and highly integrated circuits.

Agglomerated vacancy-type defects include such observable crystal defects as D-defects, Flow Pattern Defects (FPDs), Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Oxygen precipitates are generated from oxygen precipitation nuclei that are formed during the growth of the ingot. More particularly, oxygen precipitation nuclei are necessary for the formation of oxygen precipitates during subsequent thermal processing associated with electronic device fabrication. The oxygen precipitates act as gettering sites for capturing metallic impurities in the bulk of the wafer and away from the surface. Without the ability to getter metallic impurities, the electronic properties of the wafer may be negatively impacted; for example, the wafer may have a decreased minority carrier lifetime, current leakage at p-n junctions, dielectric constant discontinuity and reduced breakdown strength. In semiconductor device fabrication, there are increasing demands for adequate and robust gettering capability from oxygen precipitation in the bulk of silicon wafers while avoiding yield degradation related to oxygen precipitation at the same time.

Nitrogen-doped silicon crystals are being produced and used in various applications, largely due to the nitrogen-induced decrease in void size distributions. It is believed that, acting through vacancy trapping, nitrogen affects point defect formation in the vacancy region of the crystal, essentially shifts void formation to lower temperatures, increases the void density, and decreases the void size. Because of the trapping effect of vacancies in nitrogen doped crystals, oxygen precipitations are formed at higher density and larger sizes than in non-nitrogen doped crystals. To achieve satisfactory BMD capabilities without generating defects in polished, Epi, and annealed wafers, as well as in customers' applications, the wafers preferably exhibit substantially uniform radial density and size distributions of oxygen precipitations after thermal treatment. In some advanced semiconductor device fabrication, such larger precipitations, at higher density, are not substantially uniformly distributed, and can be problematic for various reasons. In particular, wafers sliced from nitrogen doped silicon crystals typically exhibit an increase in the BMD size and density profiles at the edge portions of the wafer after thermal treatment. Without being bound to any particular theory, it is believed that nitrogen bonds strongly with vacancies, and lower nitrogen concentration will amount to more free vacancies which, in turn, favor formation of voids. As a result, oxygen precipitates become smaller and the density is reduced in the interior regions of the crystal as compared to the edge of the crystal where, due to the presence of the surface-induced effects, the oxygen precipitate size and density trend upward in what is termed the "edge effect."

In edge effect, BMD size and density profiles characteristically trend upward at the edge portions of prior art wafer sliced from nitrogen-doped CZ silicon crystals. As shown in FIGS. 1 and 2, analysis of two prior art 300 mm diameter wafers sliced from nitrogen-doped CZ silicon crystals grown at a pull rate of about 0.78 mm/minute at a temperature differential of about 50° C./cm are depicted. The crystal was annealed at 1130° C. for Epi and with a 2-step thermal cycle for the purpose of characterizing the precipitations, with the first step at 780° C. for 3 hours and the second step at 1000° C. for 16 hours. The oxygen concentration was in the range of from 10 to 11 ppma, and the nitrogen concentration was in the range of from $3*10^{13}$ to $2*10^{14}$ atoms per $cm^3$. As shown in FIGS. 1 and 2, analysis of the two wafers show that the BMD size and density increased about 300% within 5 millimeters radially at the edge of the wafers.

One approach to dealing with the problem of agglomerated intrinsic point defects includes growing the silicon crystal ingot at a high rate in an attempt to cause the ingot to be "vacancy dominated" (i.e., silicon wherein vacancies are the predominant intrinsic point defect) and then epitaxially depositing a thin crystalline layer of silicon on the surface of the vacancy dominated single crystal silicon wafer, thereby effectively filling or covering the agglomerated vacancy defects. The epitaxial deposition process typically involves a chemical vapor deposition process wherein a single crystal silicon wafer is rapidly heated to a temperature of about 1150° C. while a gaseous silicon compound is passed over the wafer surface to deposit a silicon layer that is substantially free of agglomerated vacancy defects. The epitaxial deposition process typically annihilates oxygen precipitation nuclei formed during the growth of the ingot. One method for dealing with the problem of annihilating oxygen precipitation nuclei during epitaxial deposition is a lengthy thermal annealing process (e.g., about 4 hours at about 800° C. followed by 10 hours at about 1000° C.) to stabilize the oxygen precipitation nuclei against the rapid thermal epitaxial deposition process. Problematically, this method decreases throughput and significantly increases the cost of manufacturing the silicon wafers.

Kulkarni (U.S. Pat. No. 8,216,362) addressed the issue of lateral surface induced agglomeration of vacancies and oxygen clustering in CZ silicon crystal. However, the disclosed method focuses on the control of the lateral incorporation of vacancies at pull rates close to the critical pull rate according to the theory of Voronkov for transition from an interstitial dominated regime to a vacancy dominated regime. Thus, the pull rates disclosed by Kulkarni are relatively low. According to Voronkov's model, or theory, the temperature field in the vicinity of the melt/crystal interface drives the recombination of the point defects providing driving forces for their diffusion from the melt/crystal interface—where they exist at their respective equilibrium concentrations—into the crystal bulk. The interplay between the transport of the point defects, both by the diffusion and the convection, and their recombination establishes the point defect concentration beyond a short distance away from the interface, termed the recombination length. Typically, the difference between the vacancy concentration and the interstitial concentration beyond the recombination length, termed the excess point defect concentration, remains essentially fixed away from the lateral surface of the crystal. In a rapidly pulled crystal, the spatial redistribution of the point defects by their diffusion beyond the recombination length is generally not important—with the exception of a region close to the lateral surface of the crystal that acts as a sink or a source of the point defects. Therefore, if the excess point defect concentration beyond the recombination length is positive, vacancies remain in excess, and agglomerate to form D-defects (vacancy agglomerates identified as octahedral voids) at lower temperatures. If the excess point defect concentration is negative, interstitials remain the dominant point defects, and agglomerate to form A-defects (dislocation loops, termed A swirl defect) and B-defects (globular interstitial clusters, termed B swirl defect). If the excess point defect concentration is below some detection threshold, no detectable microdefects are formed. Thus, typically, the type of grown-in microdefects is determined. Hence, typically, the type of grown-in microdefects is determined simply by the excess point defect concentration established beyond the recombination length. The process of establishing the excess point defect concentration is termed the initial incorporation and the dominant point defect species is termed the incorporated dominant point defect. The type of the incorporated point defects is determined by the ratio of the crystal pull-rate (v) to the magnitude of the axial temperature gradient in the vicinity of the interface (G). At a higher v/G, the convection of the point defects dominates their diffusion, and vacancies remain the incorporated dominant point defects, as the vacancy concentration at the interface is higher than the interstitial concentration. At a lower v/G, the diffusion dominates the convection, allowing the incorporation of the fast diffusing interstitials as the dominant point points. At a v/G close to its critical value, both the point defects are incorporated in very low and comparable concentrations, mutually annihilating each other and thus suppressing the potential formation of any microdefects at lower temperatures. The observed spatial microdefect distribution can be typically explained by the variation of v/G, caused by a radial non-uniformity of G and by an axial variation of v. One feature of the radial microdefect distribution is that the oxide particles form through the interaction of oxygen with vacancies in the regions of relatively lower incorporated vacancy concentration at a small range of v/G marginally above the critical v/G. These particles form a narrow spatial band that can be revealed by thermal oxidation as the OSF (oxidation-induced stacking faults) ring.

Kulkarni further suggests that the lateral incorporation effect may be controlled by interface shape manipulation and changes in cooling rates. In particular, a $G_{corrected}$ value is calculated representing a revised G value that takes into account the deviation in the interface shape from a flat surface. Further, as the cooling rate of a given ingot segment increase, the number density of agglomerated defects therein increases, while the size of the agglomerated defects decreases. If the cooling rate for the ingot segment is sufficiently high, the formation of agglomerated defects may essentially be avoided. Problematically, either the interface shape manipulation or the cooling rate change are not sufficient to achieve the desired (i) radial uniformity of vacancy radius and density, (ii) radial uniformity of BMD diameter and density as a function of crystal radial location and (iii) substantial absence of an edge effect.

As new technology in device fabrication emerges and the size and structure of devices continue to become smaller and more complex, it is desired to obtain radial uniformity of BMD in controlled size and density in epitaxial wafers. A need therefore exists for nitrogen doped silicon wafers exhibiting a radial uniformly distributed oxygen precipitate density and size and with control of the edge band of oxygen precipitates.

BRIEF SUMMARY

Briefly, the present disclosure is directed to a method of producing a nitrogen-doped CZ silicon crystal ingot. The method comprises pulling the silicon crystal ingot from molten silicon at a pull rate of from about 0.85 mm per minute to about 1.5 mm per minute, wherein the silicon crystal ingot has a surface temperature gradient of from about 10° K per cm to about 35° K per cm, and wherein the silicon crystal ingot has a nitrogen concentration of from about $1*10^{13}$ atoms per $cm^3$ to about $1*10^{15}$ atoms per $cm^3$ thereby forming the nitrogen-doped CZ silicon crystal ingot.

The present disclosure is further directed to a nitrogen-doped CZ silicon crystal ingot. The ingot has a diameter of from about 150 mm to about 450 mm and has a nitrogen concentration of from about $1*10^{13}$ nitrogen atoms per cm$^3$ to about $1*10^{15}$ nitrogen atoms per cm$^3$. A wafer sliced from the silicon crystal ingot and thermally treated at 780° C. for 3 hours and then at 1000° C. for 16 hours is characterized by an increase in radial bulk micro defect size in a region extending from the center of said wafer to the edge of said wafer of less than 20%.

The present disclosure is yet further directed to a nitrogen-doped CZ silicon crystal ingot. The ingot has a diameter of from about 150 mm to about 450 mm and comprises from about $1*10^{13}$ nitrogen atoms per cm$^3$ to about $1*10^{15}$ nitrogen atoms per cm$^3$. A wafer sliced from the silicon crystal ingot and thermally treated at 780° C. for 3 hours and then at 1000° C. for 16 hours is characterized by an increase in radial bulk micro defect density in a region extending from the center of said wafer to the edge of said wafer of less than 200%.

The present disclosure is still further directed to a nitrogen-doped CZ silicon crystal ingot. The ingot has a diameter of from about 150 mm to about 450 mm and comprises from about $1*10^{13}$ nitrogen atoms per cm$^3$ to about $1*10^{15}$ nitrogen atoms per cm$^3$. A wafer sliced from the silicon crystal ingot and thermally treated at 780° C. for 3 hours and then at 1000° C. for 16 hours has an edge band in a region extending from about 1000 μm to the edge of said wafer and the edge of said wafer, the edge band comprising oxygen precipitates having an average diameter of from about 30 nm to about 100 nm and an oxygen precipitation density of from about $1*10^{8}$ atoms per cm$^3$ to about $1*10^{10}$ atoms per cm$^3$.

In some particular embodiments of the present disclosure, a polished and epitaxial wafer is made from any of the above-noted nitrogen-doped CZ silicon crystal ingots. The wafer is a single crystal CZ silicon wafer sliced from the CZ silicon single crystal ingot and comprises a front surface, a back surface, a central plane between the front and back surfaces, a circumferential edge joining the front and back surface, a central axis perpendicular to the central plane, and a bulk layer which comprises the region of the wafer between the central plane and front surface.

In other aspects of the present disclosure, a method is provided for simulating the radial bulk micro defect size distribution, radial bulk micro defect density distribution and oxygen precipitation density distribution in wafers sliced from nitrogen-doped CZ silicon crystals and thermally treated at 780° C. for 3 hours and then at 1000° C. for 16 hours. The method is implemented by a computing device including a processor coupled to a memory, the method comprises completing at least one iteration of a simulation scheme comprising: (1) receiving, by the computing device, values for at least (i) a CZ silicon crystal diameter, (ii) a CZ silicon crystal pull rate or a CZ silicon crystal pull rate range, (iii) a CZ silicon crystal nitrogen concentration or a CZ silicon crystal nitrogen concentration range and (iv) a CZ silicon crystal surface temperature gradient or a CZ silicon crystal surface temperature gradient range, and simulating, by the computing device, a thermally treated wafer radial bulk micro defect size distribution in a region extending from the center of said wafer to the edge of said wafer based on the received values; (2) receiving, by the computing device, values for at least (i) the CZ silicon crystal diameter, (ii) the CZ silicon crystal pull rate or the CZ silicon crystal pull rate range and (iii) the CZ silicon crystal nitrogen concentration or the CZ silicon crystal nitrogen concentration range, and simulating, by the computing device, a thermally treated wafer radial bulk micro defect density distribution in a region extending from the center of said wafer to the edge of said wafer based on the received values; and (3) receiving, by the computing device, values for at least (i) the CZ silicon crystal diameter, (ii) the CZ silicon crystal pull rate or the CZ silicon crystal pull rate range, (iii) the CZ silicon crystal nitrogen concentration or the CZ silicon crystal nitrogen concentration range and (iv) the CZ silicon crystal surface temperature gradient or the CZ silicon crystal surface temperature gradient range and simulating, by the computing device, a thermally treated wafer oxygen precipitation density distribution in a region extending from the center of said wafer to the edge of said wafer. The CZ silicon crystal has a diameter of from about 150 mm to about 450 mm, comprises from about $1*10^{13}$ nitrogen atoms per cm$^3$ to about $1*10^{15}$ nitrogen atoms per cm$^3$, and the thermally treated wafer has an edge band region in a region extending from about 1000 μm to the edge of said wafer to the edge of said wafer. A combination of CZ silicon crystal pull rate or CZ silicon crystal pull rate range, CZ silicon crystal nitrogen concentration or CZ silicon crystal nitrogen concentration range, and CZ silicon crystal surface temperature gradient or CZ silicon crystal surface temperature gradient range is derived from the simulation to provide conditions for preparing a thermally treated wafer having (i) an increase in radial bulk micro defect size distribution in a region extending from the center of said wafer to the edge of said wafer of less than 20% and/or (ii) an increase in radial bulk micro defect density distribution in a region extending from the center of said wafer to the edge of said wafer of less than 200%.

In still further aspects of the present disclosure, a method of controlling the edge band of oxygen precipitates in wafers sliced from nitrogen-doped CZ silicon crystals and thermally treated at 780° C. for 3 hours and then at 1000° C. for 16 hours is provided. The method is implemented by a computing device including a processor coupled to a memory. The method comprises determining, by the computing device, by simulation, a combination of (i) CZ silicon crystal diameter, (ii) CZ silicon crystal pull rate or CZ silicon crystal pull rate range, (iii) CZ silicon crystal nitrogen concentration or CZ silicon crystal nitrogen concentration range, and (iv) CZ silicon crystal surface temperature gradient or CZ silicon crystal surface temperature range that enables the preparation of a CZ silicon crystal ingot from molten silicon by the CZ process wherein a thermally treated wafer sliced therefrom and having an edge band region in a region extending from about 1000 μm to the edge of said wafer to the edge of said wafer is characterized by oxygen precipitates having an average diameter of from about 30 nm to about 100 nm. The CZ silicon crystal has a diameter of from about 150 mm to about 450 mm and the nitrogen concentration in the CZ silicon crystal is from about $1*10^{13}$ atoms per cm$^3$ to about $1*10^{15}$ atoms per cm$^3$. The simulation comprises at least one iteration of a simulation scheme comprising: (1) receiving, by the computing device, values for at least (i) a CZ silicon crystal diameter, (ii) a CZ silicon crystal pull rate or a CZ silicon crystal pull rate range, (iii) a CZ silicon crystal nitrogen concentration or a CZ silicon crystal nitrogen concentration range and (iv) a CZ silicon crystal surface temperature gradient or a CZ silicon crystal surface temperature gradient range, and simulating, by the computing device, a thermally treated wafer radial bulk micro defect size distribution in a region extending from the center of said wafer to the edge of said wafer based on the received values; (2) receiving, by the computing device, values for at least (i) the CZ silicon crystal diameter, (ii) the CZ silicon crystal pull rate or the CZ silicon crystal pull rate range and (iii) the CZ silicon crystal nitrogen concentration or the CZ silicon crystal nitrogen concentration range, and simulating, by the computing device, a thermally treated wafer radial bulk micro defect density distribution in a region extending from the center of said wafer to the edge of said wafer based on the received values; (3) receiving, by the computing device, values for at least (i) the CZ silicon crystal diameter, (ii) the CZ silicon crystal pull rate or the CZ silicon crystal pull rate range, (iii) the CZ silicon crystal nitrogen concentration or the CZ silicon crystal nitrogen concentration range and (iv) the CZ silicon crystal surface temperature gradient or the CZ silicon crystal surface temperature gradient range and simulating, by the computing device, a thermally treated wafer oxygen precipitation density distribution in a region extending from the center of said wafer to the edge of said wafer; and (4) simulating, by the computing device, the average size of the thermally treated wafer edge band oxygen precipitates based on the simulated values for (i) the thermally treated wafer radial bulk micro defect size distribution from the center of said wafer to the edge of said wafer, (ii) the thermally treated wafer radial bulk micro defect density distribution from the center of said wafer to the edge of said wafer, and (iii) the thermally treated wafer density distribution in a region extending from the center of said wafer to the edge of said wafer, wherein the computing device predicts the thermally treated wafer edge band by simulation to comprise oxygen precipitates having an average diameter of from about 30 nm to about 100 nm. The CZ silicon crystal is pulled from the molten silicon at the simulated values of CZ silicon crystal pull rate or CZ silicon crystal pull rate range, CZ silicon crystal nitrogen concentration or CZ silicon crystal nitrogen concentration range, and CZ silicon crystal surface temperature gradient or CZ silicon crystal surface temperature range to produce the nitrogen-doped CZ silicon crystal from which the treated wafers are produced.

DETAILED DESCRIPTION

Figure 1:
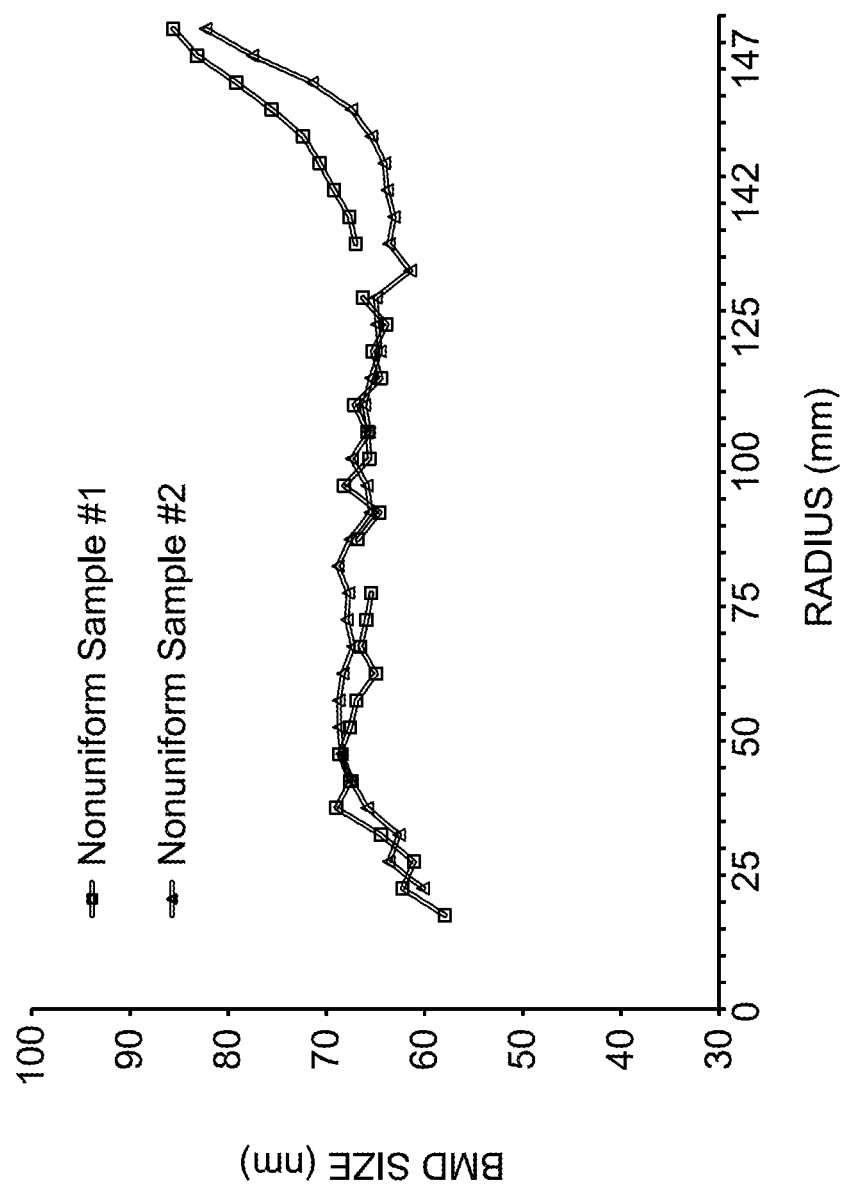
FIG. 1 is a graph showing the radial BMD size (diameter) distribution for prior art nitrogen doped 300 mm diameter thermally treated wafers sliced from CZ crystal depicting increased BMD size at the crystal edge.

In accordance with the present disclosure, a nitrogen-doped CZ single crystal silicon ingot and wafer produced therefrom is provided, the ingot is characterized by substantial radial uniformity of vacancy radius and density as a function of crystal radial location across a crystal cross section, and a thermally treated wafer sliced therefrom is characterized by substantial radial uniformity of BMD diameter and density as a function of crystal radial location across a crystal cross section, wherein the ingot and wafer exhibit the substantial absence of an edge effect.

In further accordance with the present disclosure, a method is provided for preparing a nitrogen-doped CZ single crystal silicon ingot characterized by substantial radial uniformity of vacancy radius and density as a function of crystal radial location across a crystal cross section and providing for a thermally treated wafer sliced therefrom characterized by substantial radial uniformity of BMD diameter and density as a function of crystal radial location across a crystal cross section, wherein the wafer exhibits the substantial absence of an edge effect, the method comprising controlling pull rate, surface temperature gradient and nitrogen concentration in the preparation of a single crystal ingot from molten silicon in a CZ process.

In yet further accordance with the present disclosure, a method to simulate the agglomeration of vacancies in as grown nitrogen-doped CZ single crystal silicon ingots and oxygen clustering in wafers sliced therefrom after various thermal treatments is provided, the simulation employing algorithms that predict the BMD size and density distribution and the edge band characteristics for a given diameter based on a combination variables including pull rate, nitrogen doping concentration, and crystal surface temperature gradient.

In any of the various aspects of the present disclosure, selection of a combination of (i) CZ silicon crystal ingot or wafer diameter selected from about 150 mm to about 450 mm, (ii) a nitrogen concentration within the range of from about $1*10^{13}$ to about $1*10^{15}$, (iii) a pull rate range subset within a range of from about 0.4 mm per minute to about 1.5 mm per minute, and (iv) a surface temperature gradient subset range within a range of from about 10° K per cm to about 50° K per cm at an average crystal surface temperature of from about 1300° C. to about 1415° C. provide for doped nitrogen wafers characterized, for any given diameter, by one or more of (i) an increase in radial bulk micro defect size in a region extending from the center of said wafer to the edge of said wafer of less than 20%, (ii) an increase in radial bulk micro defect density in a region extending from the center of said wafer to the edge of said wafer of less than 200% and (iii) the essential absence of an edge band effect.

Silicon crystal ingots and wafers of the present disclosure have a diameter of at least about 150 mm, at least about 200 mm, at least about 250 mm, or at least about 300 mm, such as about 150 mm, 200 mm, 250 mm, 300 mm, 350 mm, 400 mm or 450 mm. In some aspects, the diameter is about 300 mm. It should be noted that while silicon ingots are generally referred to as having a diameter of 150 mm, 200 mm, 250 mm, 300 mm or greater than 300 mm, such as 350 mm, 400 mm or 450 mm, the precise diameter may vary somewhat along the axial length due to minor variations in the process or may vary intentionally in order to grow an ingot capable of producing similarly sized wafers. For example, as is known to those skilled in the art, a 300 mm diameter ingot or wafer may optionally be prepared from an ingot or wafer of a diameter in excess of 300 mm, such as for instance 310 mm or 320 mm or more and subsequently have a portion removed from the peripheral portion of the ingot or wafer any process known in the art, such as grinding, to reduce the diameter of the ingot or wafer.

The thermally treated wafers sliced from the ingots of the present disclosure are characterized by an increase in BMD size in a region extending from the center of the wafer to the edge of the wafer of less than 20% or by an increase in bulk micro defect size in a region extending from about 10 mm to the edge of the wafer to the edge of the wafer of less than 15%. The wafers are further characterized by an increase in bulk micro defect density in a region extending from the center of the wafer to the edge of the wafer of less than 200%, or in a region extending from about 10 mm to the edge of the wafer to the edge of the wafer of less than 100%.

In some aspects of the disclosure, thermally treated wafers sliced from the ingots of the present disclosure are characterized by an edge band extending in a region extending from about 5000 μm, 4000 μm, 3000 μm, 2000 μm or 1000 μm to the edge (lateral surface) of the crystal to the edge of the crystal. The edge band is characterized by oxygen precipitates having an average diameter of from about 30 nm to about 100 nm and an oxygen precipitation density of from about $1*10^8$ atoms per cm$^3$ to about $1*10^{10}$ atoms per cm$^3$ and by voids having an average radius of from about 1 nm to about 50 nm. The BDM size and density distribution in the edge band is substantially similar to the distribution in a region extending from the central axis to the edge band. In some aspects of the disclosure, the edge band radial BMD size differs from the BMD size in the remainder of the wafer by no more than 20%. In some other aspects of the disclosure, the edge band BMD density differs from the BMD density in the remainder of the wafer by no more than 200%

Single crystal silicon ingots may be grown according to the standard CZ method. Single crystal silicon ingots are grown in a crystal puller. See, e.g., U.S. Pat. No. 6,554,898 and WO 99/27165 (both assigned to SunEdison Semiconductor Technology PTE. Ltd.), the disclosures of which are incorporated herein as if set forth in their entireties. A typical CZ puller comprises a housing; a crucible in the housing for containing molten silicon; a pulling mechanism for pulling a growing ingot upward from the molten silicon; and heating mechanism in proximity to the crucible sufficient to melt solid silicon starting material (i.e., a polycrystalline charge comprising polycrystalline granules and/or chunk polycrystalline) into a molten silicon bath. Polycrystalline material may be charged to the crucible according to techniques known in the art, e.g., as described in WO 99/55940 (assigned to SunEdison Semiconductor Technology PTE. Ltd.).

Ingot growth according to the CZ method begins by melting a charge of solid silicon starting material by applying power to the heating mechanism. See, e.g., WO 99/20815 (assigned to SunEdison Semiconductor Technology PTE. Ltd.). The melt flow may be stabilized by crucible rotation rate, inert gas flow rate, etc. prior to dipping a seed crystal into the melt. Pulling the seed upwards crystallizes the melt at the solid-liquid interface and the crystal proceeds to grow. A conical neck of increasing diameter from the seed crystal is grown by decreasing the pull rate of the seed crystal from the melt. Once the desired diameter is reached, the pull rate is gradually increased until the crystal grows a substantially constant diameter region. The heating mechanisms of the crystal pulling apparatus are controlled in order to control the solidification and cooling rate of the growing silicon ingot. The crucible is typically rotated in the opposite sense to the crystal to stabilize the melt flow and control the oxygen concentration in the crystal. The final stage of the crystal growth is the tail growth where the diameter is slowly decreased and a conical shape is achieved, in which the diameter of the end cone decreases in the axial direction from the constant diameter region toward the end of the crystal. Once the crystal has detached from the melt, the power to the puller is decreased and the crystal is cooled down while being lifted into an upper chamber. At the end of the process, the crystal is removed from the puller for further processing.

Crystal ingots of the present disclosure comprise a central axis, a seed end, an opposite end, and a constant diameter portion between the seed end and the opposite end having a lateral surface and a radius, r, extending from the central axis to the lateral surface, the single crystal silicon ingot being grown from a silicon melt and then cooled from the solidification in accordance with the CZ method. The single crystal silicon ingot is characterized by a constant diameter portion comprising a radially symmetric region in which vacancies are the predominant intrinsic point defect, the radially symmetric region having a radius extending from the central axis to the lateral surface.

Some aspects of the present disclosure are directed to a single crystal silicon wafer obtained (sliced) from an ingot, as detailed herein above. More particularly, the present disclosure is directed to a single crystal silicon wafer having a diameter of from about 150 mm to about 450 mm. The wafer preferably has a front surface, a back surface, an imaginary central plane between the front and back surfaces and substantially parallel to the front and back surfaces, and a circumferential edge joining the front surface and the back surface. The wafer additionally comprises an imaginary central axis perpendicular to the central plane and a radial length that extends from the central axis to the circumferential edge. The terms "front" and "back" in this context are used to distinguish the two major, generally planar surfaces of the wafer. The front surface of the wafer (as that phrase is used herein) is not necessarily the surface onto which an electronic device will subsequently be fabricated, nor is the back surface of the wafer (as that phrase is used herein) necessarily the major surface of the wafer which is opposite the surface onto which the electronic device is fabricated. In addition, because silicon wafers typically have some total thickness variation (TTV), warp, and bow, the midpoint between every point on the front surface and every point on the back surface may not precisely fall within a plane. As a practical matter, however, the TTV, warp, and bow are typically so slight that, to a close approximation, the midpoints can be said to fall within an imaginary central plane which is approximately equidistant between the front and back surfaces. The wafer may be polished or, alternatively, lapped and etched but not polished. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, New York, 1982 (incorporated herein by reference). Preferably, the wafers are polished and cleaned by standard methods known to those skilled in the art. See, for example, W. C. O'Mara et al., Handbook of Semiconductor Silicon Technology, Noyes Publications.

According to previous publications (see, e.g., WO 98/45507, WO 98/45508, WO 98/45509, and WO 98/45510, all assigned to SunEdison Semiconductor Technology PTE. Ltd.), the type and initial concentration of intrinsic point defects is initially determined as the ingot cools from the temperature of solidification (i.e., about 1410° C.) to a temperature greater than 1300° C. That is, the type and initial concentration of these defects are controlled by the ratio v/G, where v is the growth velocity and G is the average axial temperature gradient over this temperature range. As the value of v/G increases, a transition from decreasingly self-interstitial dominated growth to increasingly vacancy dominated growth occurs near a critical value of $v/G_o$ which, based upon currently available information, appears to be about $2.1*10^{-5}$ cm$^2$/sK, where $G_o$ is determined under conditions in which the axial temperature gradient is constant within the temperature range defined above. At this critical value, the concentrations of these intrinsic point defects are at equilibrium. As the value of $v/G_o$ exceeds the critical value, the concentration of vacancies increases. Likewise, as the value of $v/G_o$ falls below the critical value, the concentration of self-interstitials increases.

Thermal treatment cycles typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Oxygen precipitation behavior in CZ silicon material is strongly influenced by intrinsic point defect concentrations. For example in lightly doped material, generally strong precipitation is observed in vacancy type material whereas in interstitially type material, no precipitation occurs. Any thermal treatment sufficient to nucleate and grow oxygen precipitates is suitable for preparing wafers of the present disclosure with uniform and high oxygen precipitates throughout the wafer, i.e., in a region extending from the central axis to the circumferential edge and further in a region extending from the front surface of the wafer to the back surface of the wafer. In some embodiments, the BMD may be characterized by subjecting the wafers to an oxygen precipitation heat-treatment at a temperature in excess of about 700° C. for a duration sufficient to nucleate and grow oxygen precipitates. In some other characterization embodiments, the wafers may be subjected to an oxygen precipitation heat treatment comprising the NEC1 test procedure, e.g., annealing the wafer for 4-8 hours at 800° C. and then 16 hours at 1000° C. In some other characterization embodiments, the wafers may be subjected to an oxygen precipitation heat treatment comprising annealing the wafer for 3 hours at 780° C. and then 16 hours at 1000° C. In some other embodiments, the wafers are post epitaxial wafers that have been subjected to oxygen precipitation heat treatment wherein the post epitaxial treatment is done at a temperature of about 900° C., about 950° C., about 1000° C., about 1050° C., about 1100° C., about 1150° C., or about 1200° C., and ranges thereof, such as from about 900° C. to about 1200° C., from about 1000° C. to about 1200° C., or from about 1050° C. to about 1150° C.

Nitrogen dopant concentration, CZ silicon crystal pull rate, and CZ crystal temperature gradient during pulling affect BMD size and distribution in thermally treated wafers sliced from the CZ silicon crystal ingots. In any of the various aspects of the disclosure, the BMD size distribution, the BMD density distribution and the edge band characteristics of the present CZ silicon crystal ingots and wafers may be controlled by selection of variables within the ranges described below as determined by the modeling and simulation techniques also described below. Preferred ranges may suitably vary with ingot diameter. In one embodiment, the nitrogen dopant concentration range is from about $1*10^{13}$ atoms per cm$^3$ to about $1*10^{15}$ atoms per cm$^3$, the pull rage range is from about 0.4 mm per minute to about 1.5 mm per minute, and the ingot surface temperature gradient is from about 10° K per minute to about 50° K per minute at an average crystal surface temperature of from about 1300° C. to about 1415° C. In one embodiment, for a 300 mm diameter ingot, the nitrogen dopant concentration range is from about $1*10^{13}$ atoms per cm$^3$ to about $1*10^{15}$ atoms per cm$^3$, the pull rage range is from about 0.85 mm per minute to about 1.5 mm per minute, and the ingot surface temperature gradient is from about 10° K per cm to about 35° K per cm at an average crystal surface temperature of from about 1300° C. to about 1415° C.

Nitrogen Dopant Concentration

The silicon crystals of the present disclosure comprise nitrogen dopant atoms that induce a decrease in void size distributions in CZ silicon. Nitrogen concentration affects the radius of as-grown oxygen clusters as a function of crystal radial location. The nitrogen concentration in the silicon crystal is from about $1*10^{13}$ atoms per cm$^3$ to about $1*10^{15}$ atoms per cm$^3$ or from about $1*10^{13}$ atoms per cm$^3$ to about $1*10^{15}$ atoms per cm$^3$. The ingot may be doped with nitrogen by any of various methods known in the art including, for example, introducing nitrogen gas into the growth chamber and/or adding nitrogen to the polysilicon melt. The amount of nitrogen being added to the growing crystal is more precisely controlled by adding the nitrogen to the polysilicon melt, as such, it is the preferred method. Typical polysilicon melt nitrogen concentrations are from about $1*10^{16}$ atoms per cm$^3$ to about $1*10^{18}$ atoms per cm$^3$, or from about $1*10^{17}$ atoms per cm$^3$ to about $1*10^{18}$ atoms per cm$^3$, or from about $1*10^{17}$ atoms per cm$^3$ to about $5*10^{17}$ atoms per cm$^3$. The amount of nitrogen added to the crystal may be readily determined, for example, by depositing a layer of silicon nitride ($Si_3N_4$) of a known thickness on silicon wafers of a known diameter which are introduced into the crucible with the polysilicon prior to forming the silicon melt (the density of $Si_3N_4$ is about 3.18 g/cm$^3$).

It is believed that because nitrogen bonds strongly with vacancies (see M. Kulkarni, *Defect Dynamics in the presence of nitrogen in growing Czochralski silicon crystals*, Journal of Crystal Growth, Volume 310, pages 324-335 (2008)), lower nitrogen concentration will amount to more free vacancies which favors formation of voids and hence, oxygen precipitates become smaller in the interior regions of the crystal. As previously disclosed, nitrogen-doping incudes a void size distribution decrease in CZ silicon crystals. It is believed that, acting through vacancy trapping, nitrogen affects point defect formation in the vacancy region of the crystal, essentially shifts void formation to lower temperatures, increases the void density, and decreases the void size. Because of the trapping effect of vacancies in nitrogen doped crystals, oxygen precipitations are formed at higher density and larger sizes than in non-nitrogen doped crystals. Without being held to a particular theory, it is believed that the nitrogen dopant atoms thermally stabilize the oxygen precipitation nuclei by retarding the diffusion of the vacancies in the silicon crystal. Specifically, it is known that as the growing crystal cools the concentration of vacancies reaches a level of critical super saturation (i.e., at which point an agglomeration event occurs) which results in the formation of agglomerated vacancy defects or micro-voids. For example, the super saturation of may occur at a temperature of about 1150-1050° C. As the crystal cools, the micro-voids grow in size because vacancies continue to diffuse to the sites. Although the agglomeration event and continued growth of the micro-voids significantly reduces the concentration of non-agglomerated, or "free," vacancies in the crystal, upon continued cooling a second level of critical super saturation is reached in which the free vacancies and oxygen in the crystal interact to form oxygen precipitation nuclei. For a non-nitrogen doped crystal, the second level of critical super saturation occurs as the crystal cools below about 700° C. In nitrogen doped silicon, however, the formation of micro-voids during the agglomeration event is slightly suppressed due to the slower diffusion rate of the vacancies. This results in a higher concentration of free vacancies remaining in the crystal after the first agglomeration event. The increased concentration of free vacancies in the nitrogen doped silicon increases the temperature at which the second level of critical super saturation occurs, e.g., at about 800° C. to about 1050° C. At the increased temperature, the oxygen atoms in the crystal are more mobile and more oxygen atoms interact with the free vacancies which results in oxygen precipitation nuclei which are more stable. The stabilized oxygen precipitation nuclei are more resistant to dissolution during subsequent thermal processing such as the growth of an epitaxial silicon layer.

Figure 7:
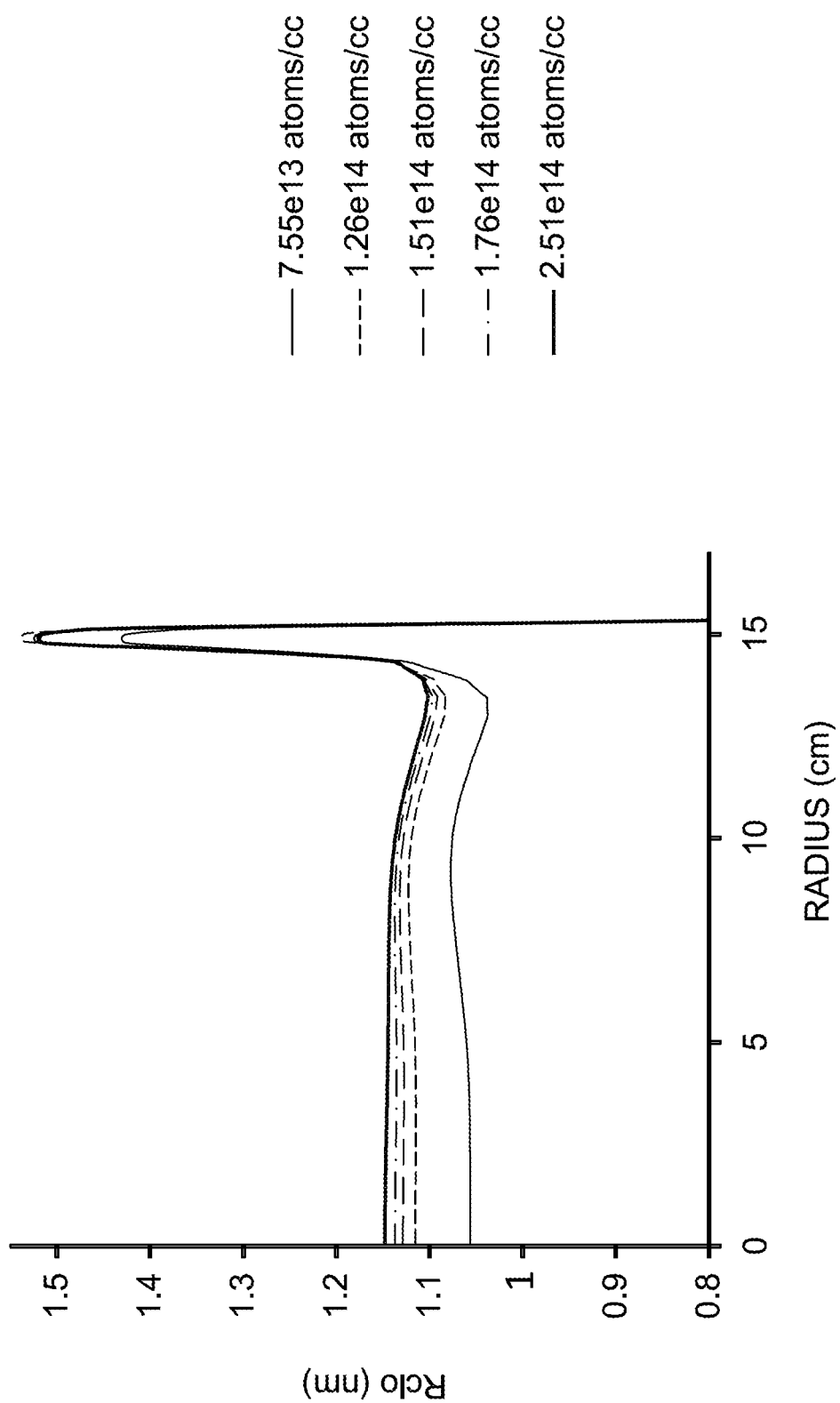
FIG. 7 is a graph showing the predicted effect of nitrogen concentration on the radii of as-grown oxygen precipitates as a function of crystal radial location across the crystal cross section of a 30 cm diameter CZ silicon crystal.
Figure 8:
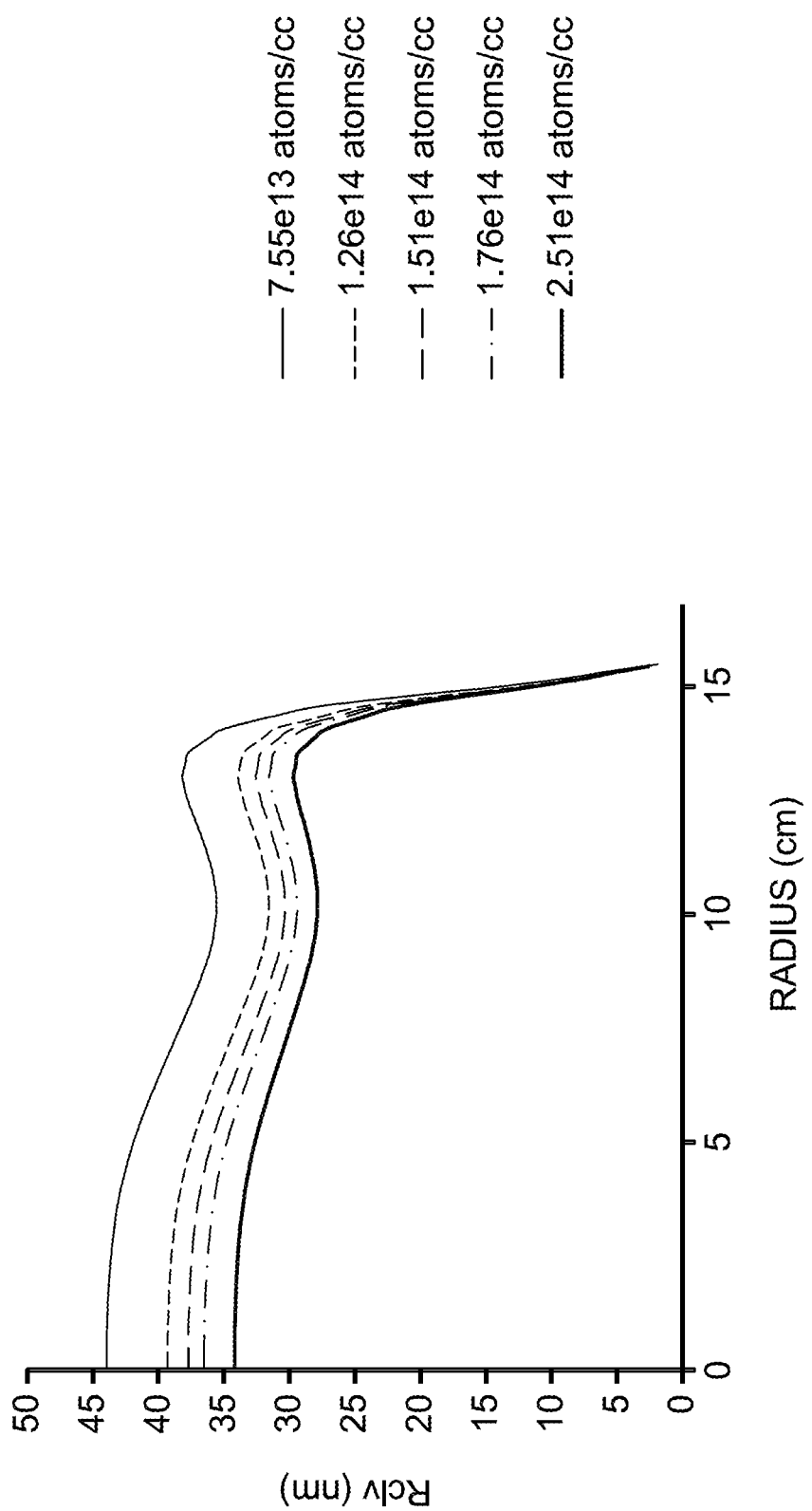
FIG. 8 is a graph showing the predicted effect of nitrogen concentration on the radii of as-grown voids as a function of crystal radial location across the crystal cross section of a 30 cm diameter CZ silicon crystal.

As depicted in FIGS. 7 and 8, close to the edge, due to the presence of the surface-induced effects, the predicted oxygen precipitate sizes are not similarly compensated. Particularly, as shown in FIG. 7, nitrogen concentration affects the radius of as-grown oxygen clusters as a function of crystal radial location resulting in an uneven distribution of radius size wherein, for a 300 mm diameter ingot, oxygen cluster radii increases dramatically at the edge region. As shown in FIG. 8, nitrogen concentration affects the radius of as-grown voids as a function of crystal radial location resulting in an uneven distribution of radius size wherein, for a 300 mm diameter ingot, void size radii decreases dramatically at the edge region.

Figure 9:
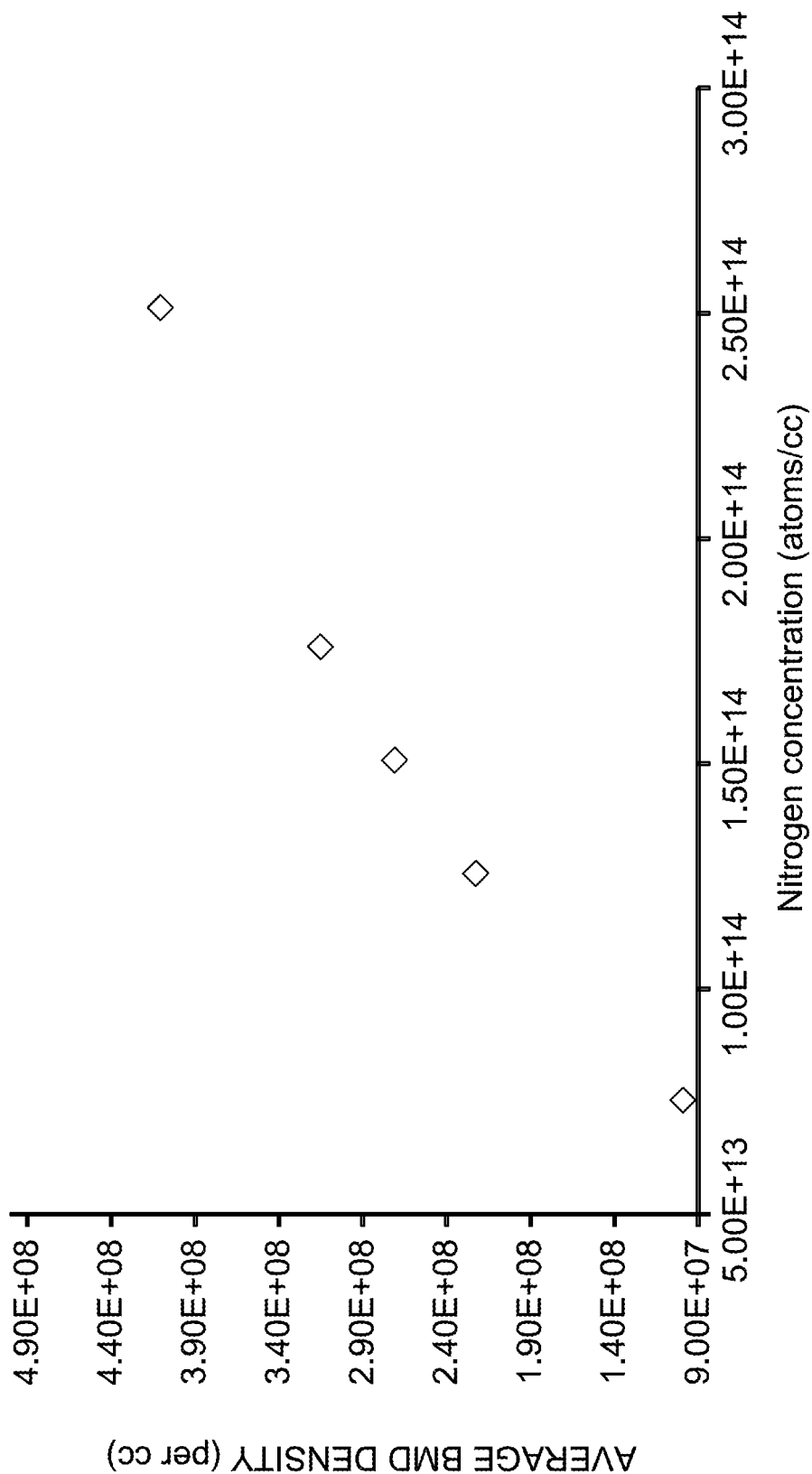
FIG. 9 is a graph showing the predicted average BMD density as a function of nitrogen concentration for constant high temperature annealing done at 1100° C.
Figure 10:
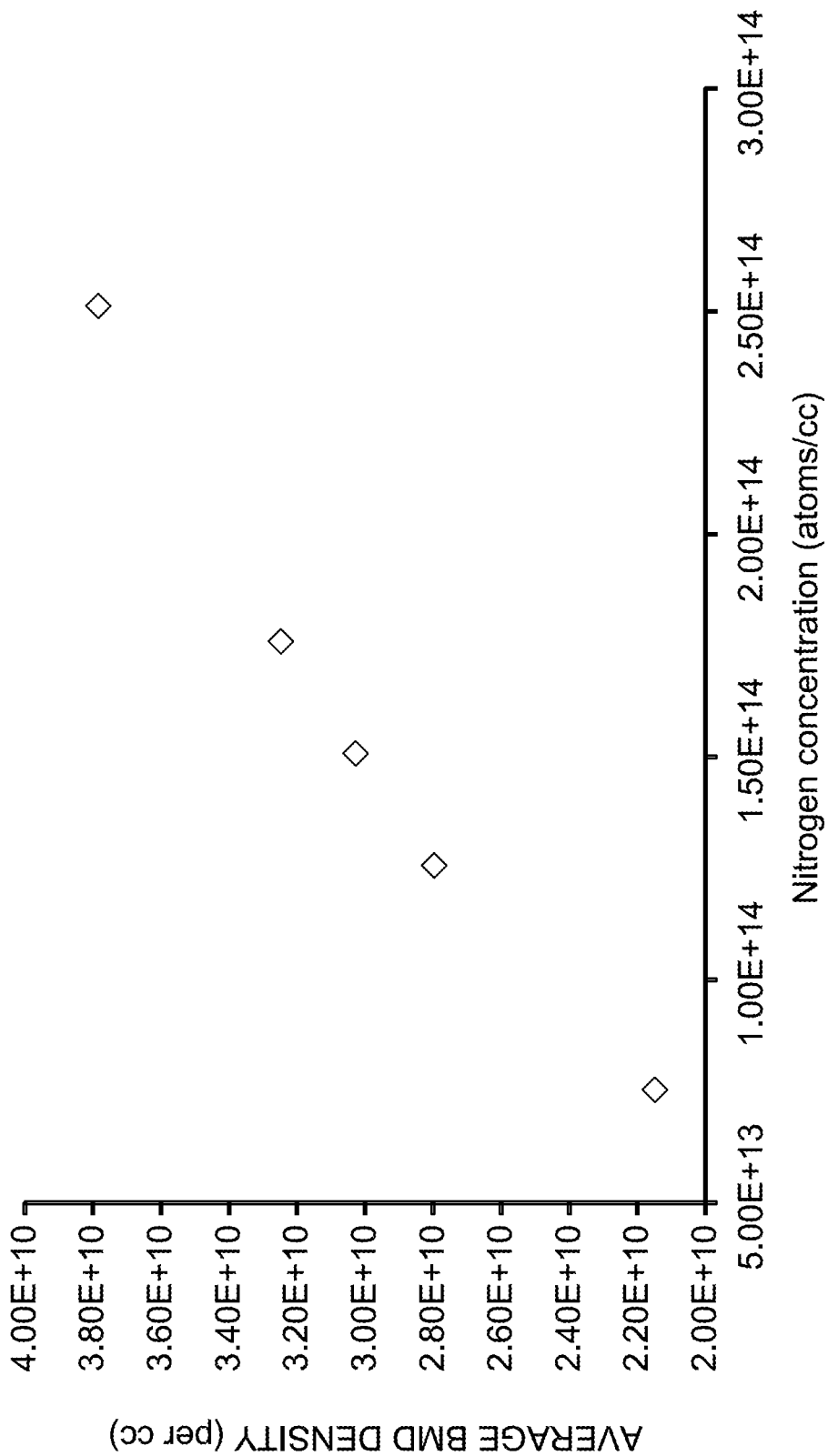
FIG. 10 is a graph showing the predicted average BMD density as a function of nitrogen concentration for constant high temperature annealing done at 1100° C.

The dependence of average BMD density resulting from the effect of nitrogen concentration is believed to be independent of annealing temperature. As depicted in FIG. 9, the predicted average BMD density varied from about $9.1*10^7$ per cm$^3$ at an ingot nitrogen concentration of about $7.5*10^{13}$ atoms per cm$^3$ to about $4.1*10^8$ per cm$^3$ at an ingot nitrogen concentration of about $2.5*10^{14}$ atoms per cm$^3$ at an annealing temperature of 1100° C. As depicted in FIG. 10, the predicted average BMD density varied from about $2.15*10^{10}$ per cm$^3$ at an ingot nitrogen concentration of about $7.5*10^{13}$ atoms per cm$^3$ to about $3.75*10^{10}$ per cm$^3$ at an ingot nitrogen concentration of about $2.5*10^{14}$ atoms per cm$^3$ at an annealing temperature of 1000° C. Although the average BMD density was greater at 1000° C. than at 1100° C., the dependence of average BMD density based on nitrogen concentration was similar at both temperatures.

Pull Rate

Figure 3:
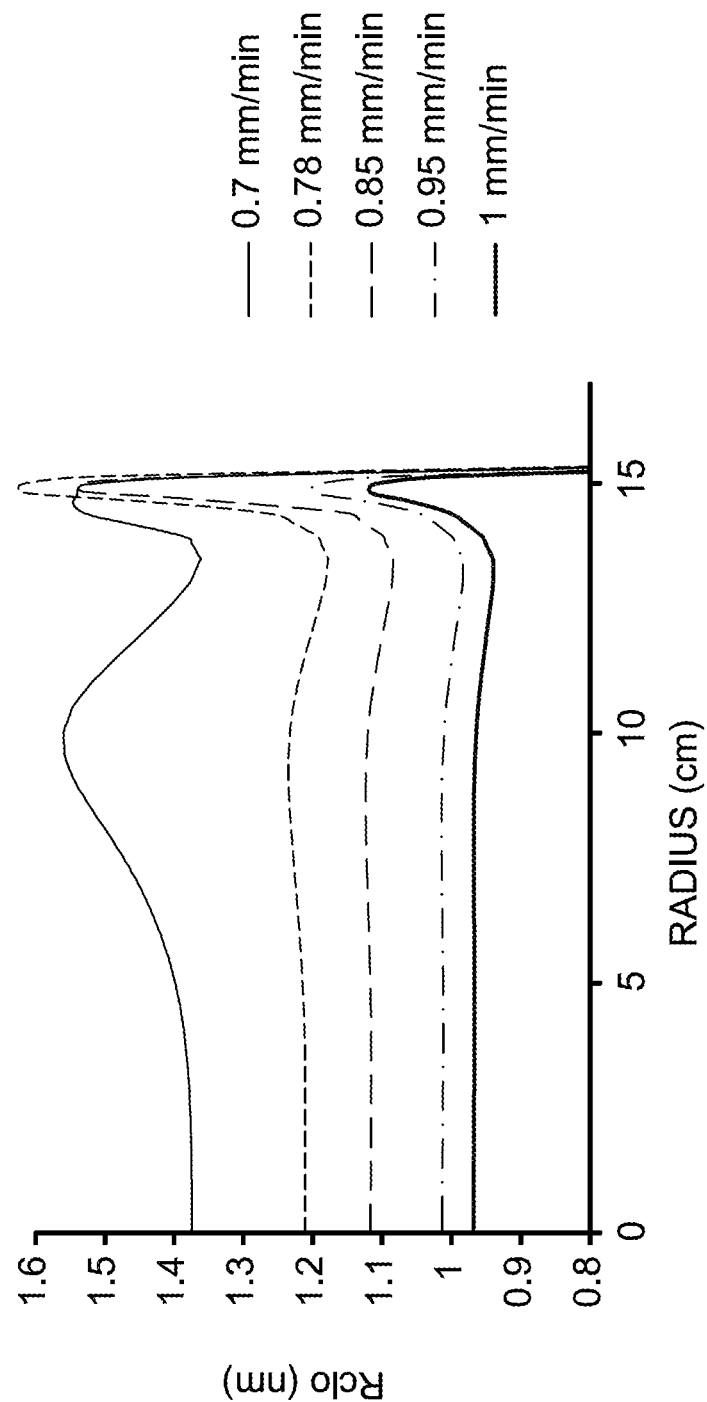
FIG. 3 is a graph showing the predicted effect of pull rate on the radius of as-grown crystal clusters as a function of crystal radial location across the crystal cross section of a 30 cm diameter CZ silicon crystal.
Figure 4:
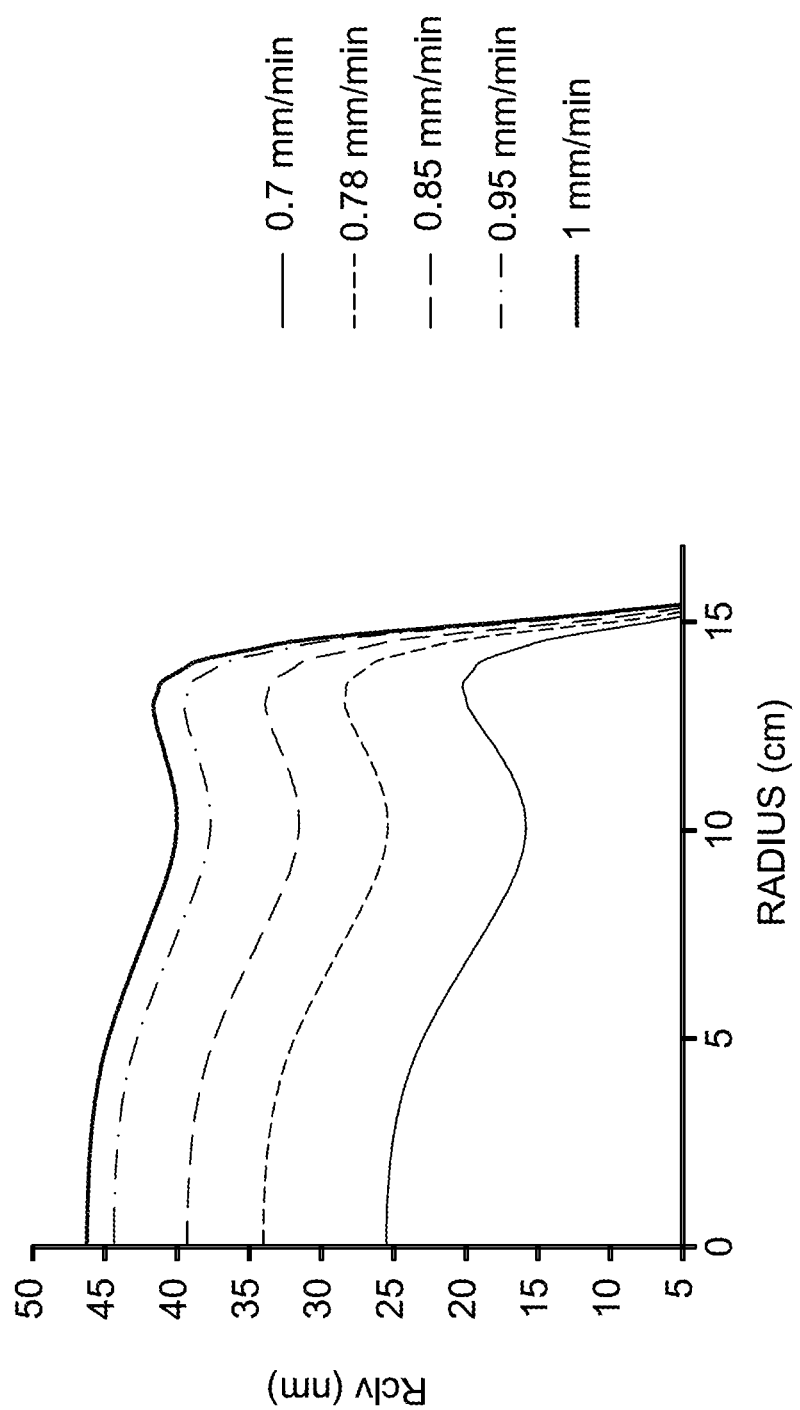
FIG. 4 is a graph showing the predicted effect of pull rate on the radius of as-grown voids (vacancy clusters) as a function of crystal radial location across the crystal cross section of a 30 cm diameter CZ silicon crystal.

As shown in FIG. 3, pull rate affects the predicted radius of as-grown oxygen clusters as a function of crystal radial location resulting in an uneven distribution of radius size. For pull rates on the order of about 0.78 mm/min for a 300 mm diameter ingot, oxygen cluster radii increases dramatically at the edge region. As shown in FIG. 4, pull rate affects the predicted radius of as-grown voids as a function of crystal radial location resulting in an uneven distribution of radius size wherein, for a 300 mm diameter ingot, void size radii decreases dramatically at the edge region at pull rates of 0.7 mm/min or greater. The data upon which FIGS. 3 and 4 are based was obtained for a constant oxygen concentration of $5.5*10^{10}$ atoms/$cm^3$ and a nitrogen concentration of $1.26*10^{14}$ atoms/$cm^3$ across the cross-section. For each pull rate, the crystal surface temperature gradient close to the melt/crystal interface was 51.14° K/cm. The in-grown vacancies in the crystal can agglomerate into voids as well as facilitate formation of oxygen clusters as the crystal temperature drops. There is a peak in the size profiles of both vacancy clusters as well as oxygen clusters, found for each case, close to the crystal surface. At high pull rate values, the edge peak for voids size is much less steeper than the one observed for the oxygen clusters. This observation is consistent with the established theory on lateral incorporation effect. At a lower pull rate, less vacancies are incorporated everywhere, which delays void formation but, in the vacancy dominated crystal, at these high crystal pull rates, can facilitate formation of oxygen clusters earlier. Therefore, it is the competition between void formation and oxygen cluster formation depending on the free vacancy concentration, which is determined based on axial incorporation, strength of bonding with oxygen and nitrogen, and lateral incorporation, which needs to be tailored to increase the uniformity in the size distribution of oxygen clusters. Increasing the pull rate brings in enough vacancies everywhere, increasing the void sizes and lowering the oxygen cluster sizes. It has been discovered that the edge band of oxygen precipitation decreases dramatically in its intensity when pull rate is increased to about 0.95 mm/min or even 1 mm/min.

Pull rate ranges within the scope of the present disclosure vary with ingot diameter and are generally from about 0.4 to about 1.5 mm/min, from about 0.5 to about 1.5 mm/min, from about 0.6 to about 1.5 mm/min, from about 0.7 to about 1.5 mm/min. Rates within the scope of the present disclosure include about 0.4 mm/min, about 0.5 mm/min, about 0.6 mm/min, about 0.7 mm/min, about 0.78 mm/min, about 0.8 mm/min, about 0.85 mm/min, about 0.9 mm/min, about 1.0 mm/min, about 1.1 mm/min, about 1.2 mm/min, about 1.3 mm/min, about 1.4 mm/min, about 1.5 mm/min, and ranges thereof. For instance, A pull rate of from about 0.85 mm/min to about 1.5 mm/min, from about 0.85 mm/min to about 1.0 mm/min or from about 0.9 mm/min to about 1.0 mm/min is generally preferred for a 300 mm ingot. Pull rate ranges for ingots having a diameter in excess of 300 mm, such as about 400 mm or about 450 mm are preferably less than about 0.8 mm/min, such as from about 0.4 to about 0.7 mm/min, from about 0.5 to about 0.7 mm/min, or from about 0.5 to about 0.6 mm/min. Pull rates that provide for v/G in excess of the critical value according to the Voronkov theory are preferred.

Figure 5:
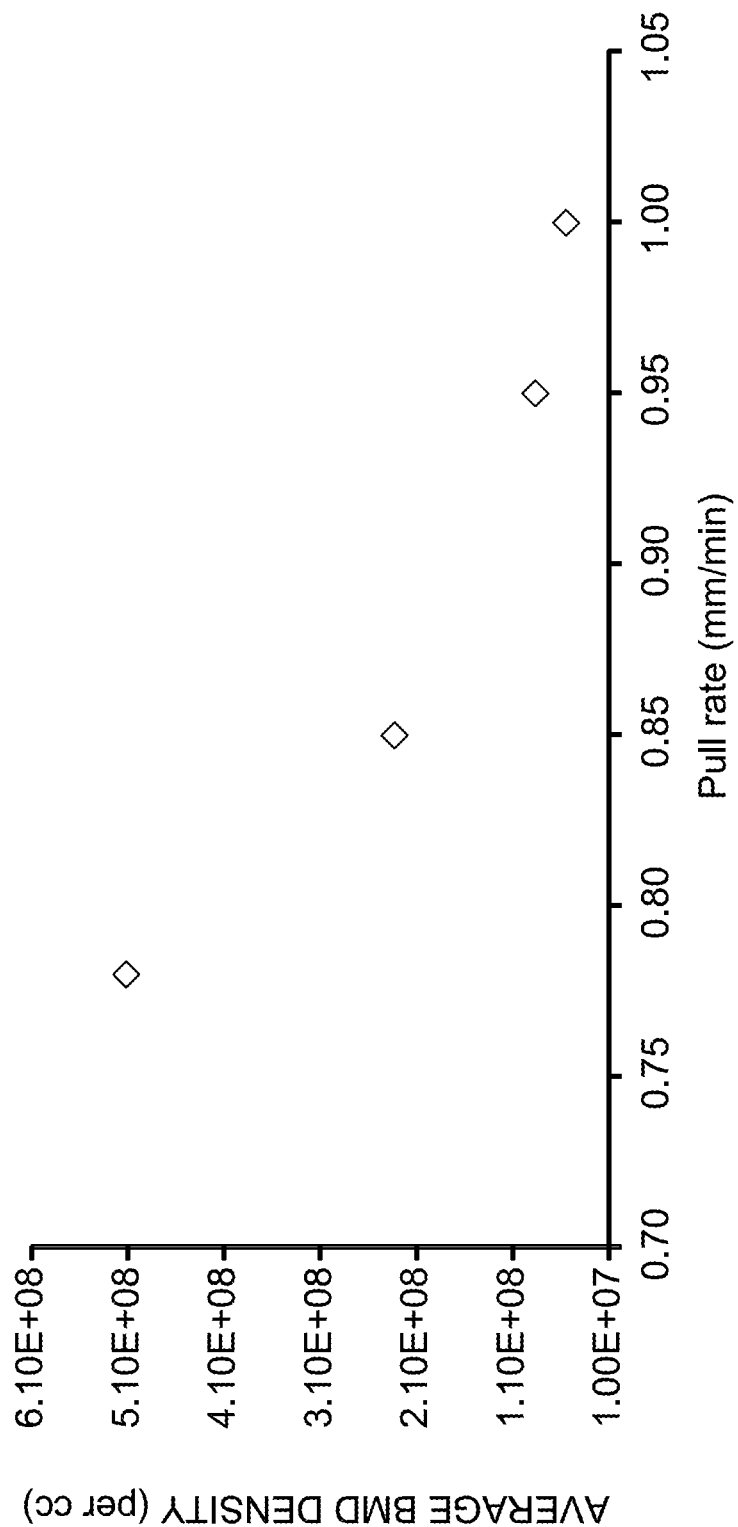
FIG. 5 is a graph showing the predicted average BMD density as a function of pull rate for constant high temperature annealing done at 1100° C.
Figure 6:
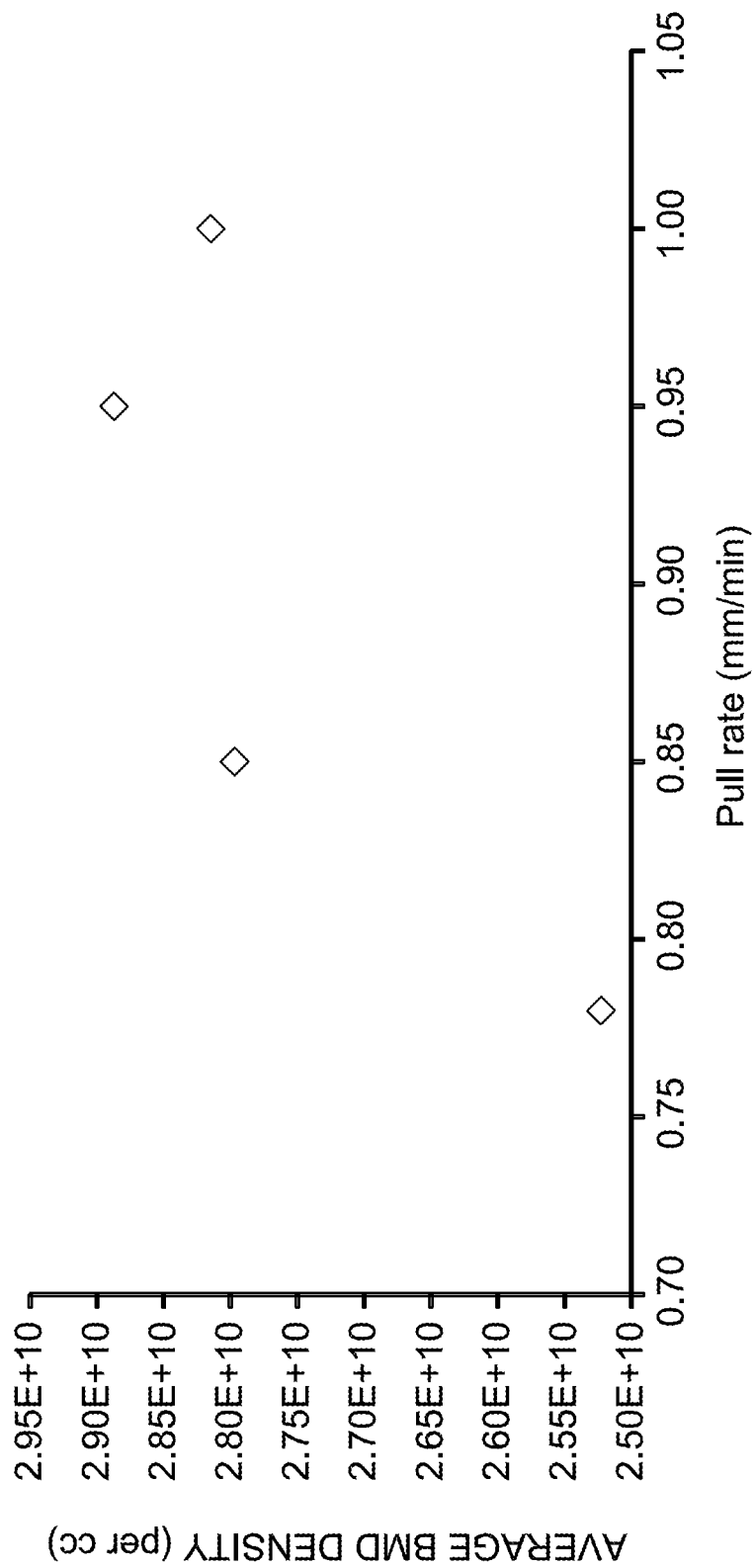
FIG. 6 is a graph showing the predicted average BMD density as a function of pull rate for constant high temperature annealing done at 1000° C.

The average BMD density was found to be a function of the pull rate wherein the characteristics of this functionality changes depending upon the annealing temperature. For instance, as shown in FIG. 5, at an annealing temperature of 1100° C., the predicted average BMD density for a 300 mm ingot is about 2 orders of magnitude lower than for an annealing temperature of 1000° C., and it decreases with increase in pull rate. As shown in FIG. 6, the predicted average BMD density for a 300 mm ingot is about 2 orders of magnitude greater than for the 1100° C. annealing temperature and increases with increasing pull rate up to 0.95 mm/min and drops slightly at 1 mm/min.

Temperature Gradient

Figure 11:
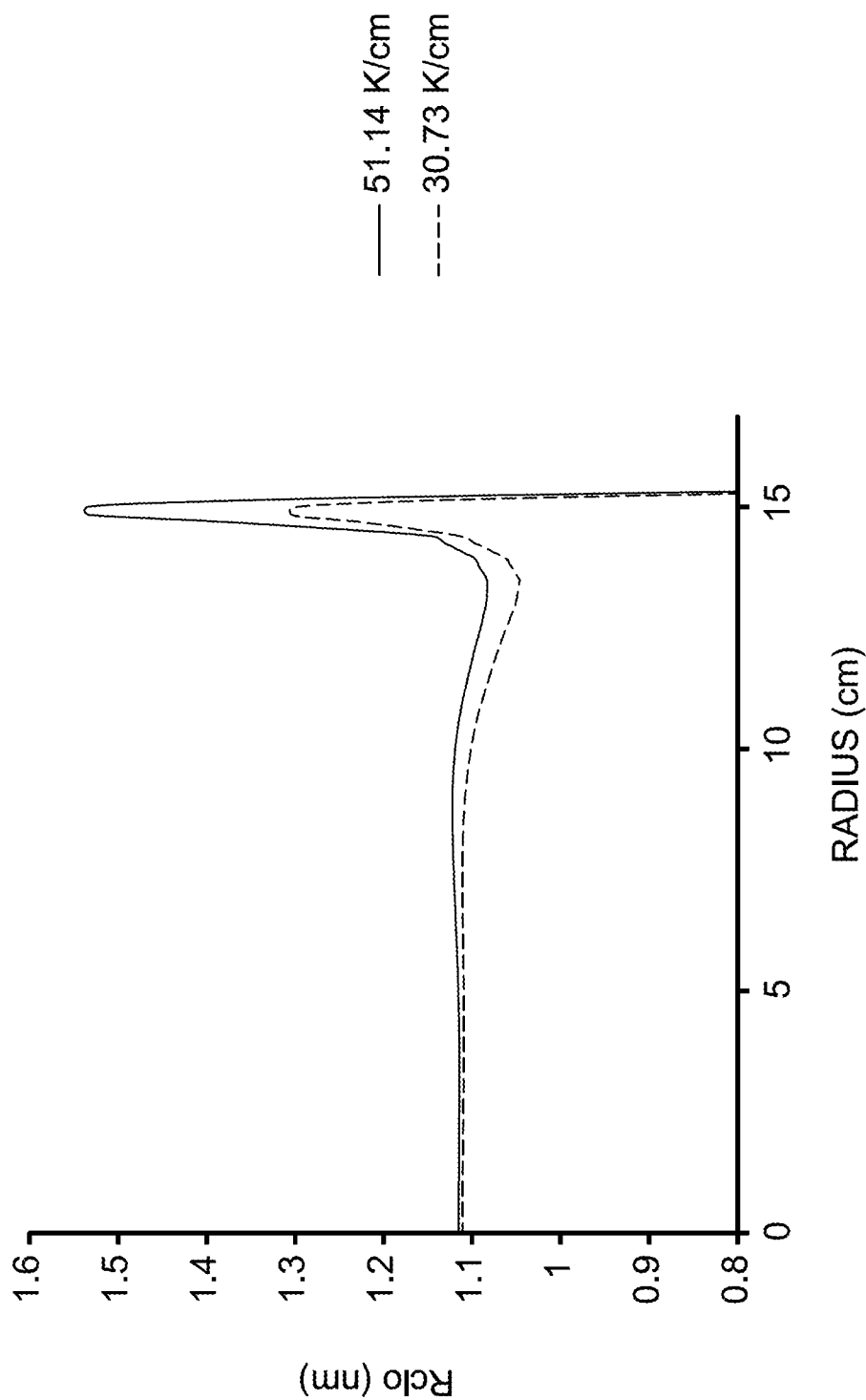
FIG. 11 is a graph showing the predicted effect of crystal surface temperature gradient on the radii of as-grown oxygen precipitates plotted as a function of radial location across the crystal cross section of a 30 cm diameter CZ silicon crystal.
Figure 12:
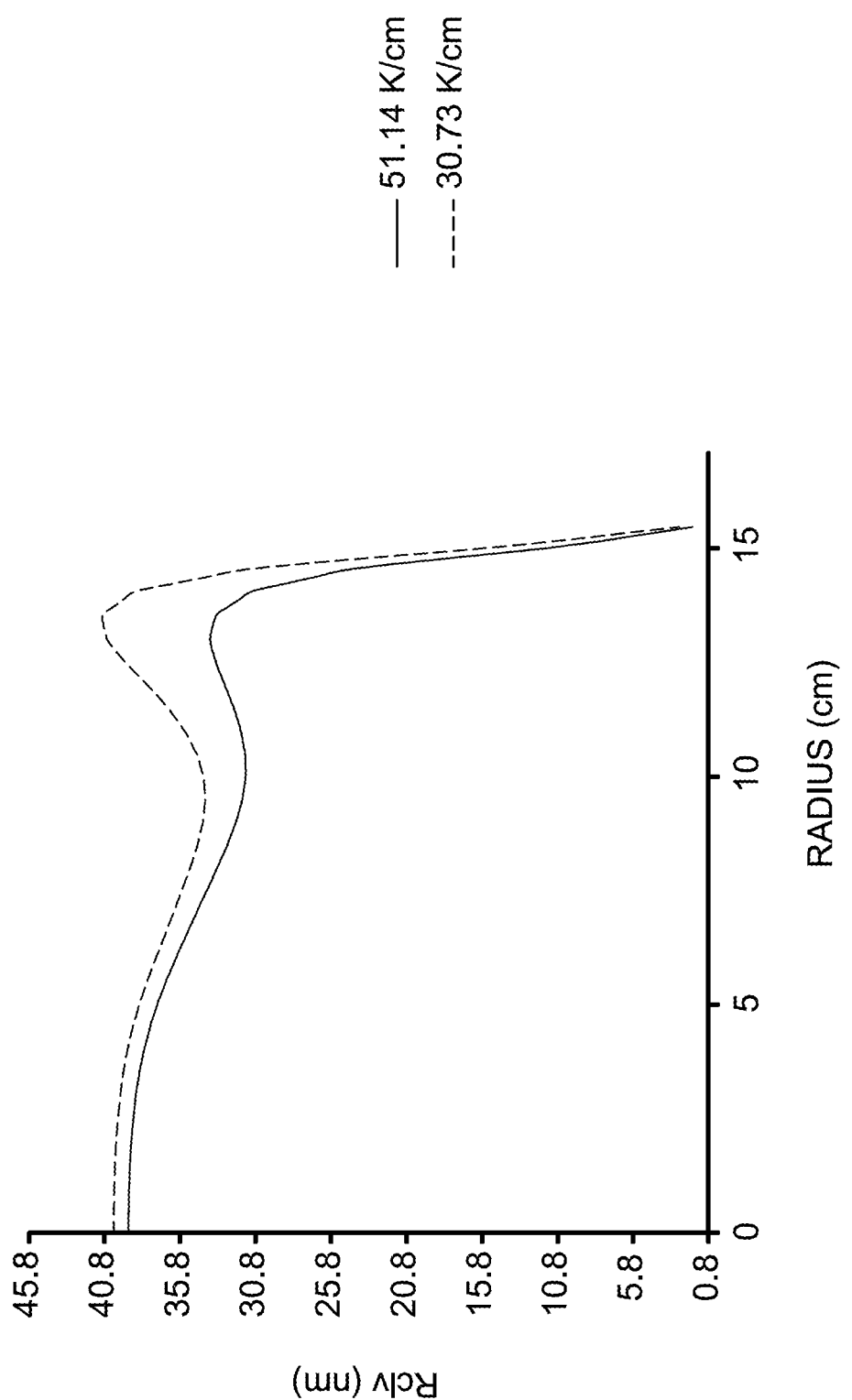
FIG. 12 is a graph showing the predicted effect of crystal surface temperature gradient on the radii of as-grown voids plotted as a function of radial location across the crystal cross section of a 30 cm diameter CZ silicon crystal.

The average axial temperature gradient to which a growing CZ crystal is exposed affects the void size distribution across a crystal cross-section from the central axis to the edge. Generally, void size increase is inversely proportion to temperature gradient such that the void size increases especially close to the crystal edge in response to a reduction in the temperature gradient at the crystal edge close to the melt/crystal interface. This predicted effect is depicted in FIGS. 11 and 12. This, in effect, helps to diminish the size of oxygen precipitates close to the crystal edge while the oxygen precipitate size in the interior of the crystal is substantially unaffected by temperature gradient.

The reduction in temperature gradient on the crystal surface close to the melt/crystal interface can be made by exposing that part more to hotter sections of the hot zone. For example, one way of achieving this is by increasing the gap between melt surface and the bottom of the reflector graphite (also known as "Hr"). Another method is to increase the side heater power by running higher bottom heater power.

Temperature gradients ranges within the scope of the present disclosure are from about 10° K to about 50° K per cm, from about 10° K to about 35° K per cm, from about 25° K to about 50° K per cm, from about 25° K to about 45° K per cm, from about 30° K to about 45° K per cm, or from about 35° K to about 45° K per cm at an average crystal surface temperature of from about 1300° C. to about 1415° C. Temperature gradients include about 10° K per cm, about 20° K per cm, about 25° K per cm, about 30° K per cm, about 35° K per cm, about 40° K per cm, about 45° K per cm, about 50° K per cm, and various ranges thereof.

Figure 13:
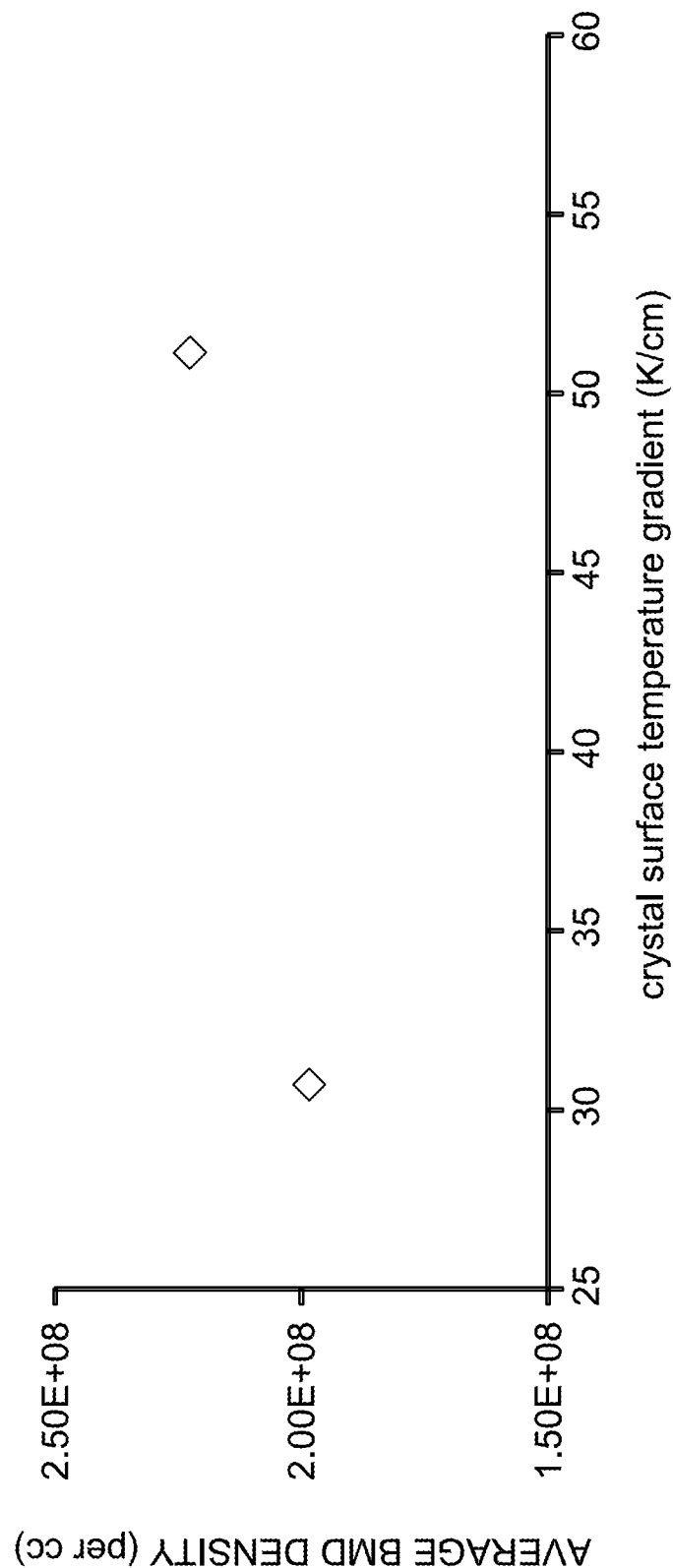
FIG. 13 is a graph showing the predicted average BMD density as a function of crystal surface temperature gradient for constant high temperature annealing done at 1100° C.
Figure 14:
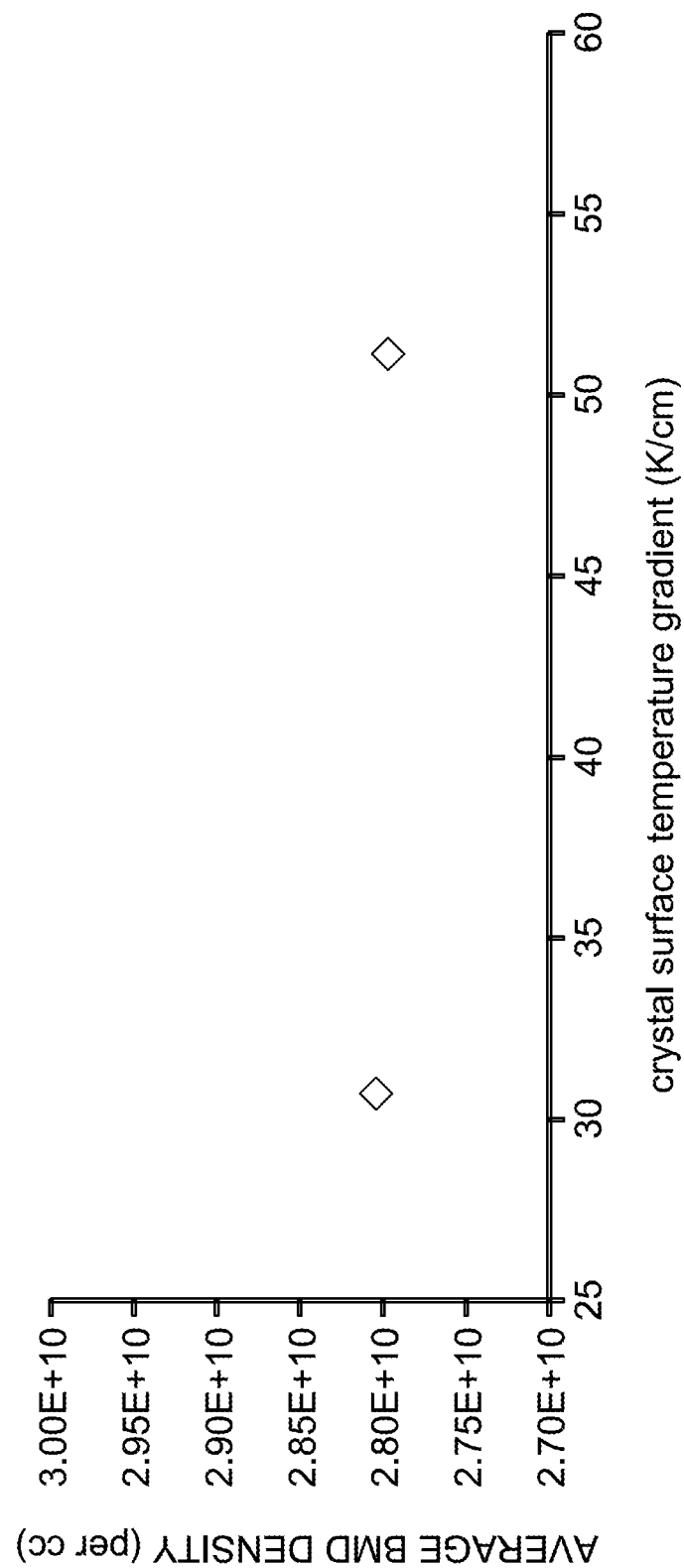
FIG. 14 is a graph showing the predicted average BMD density as a function of crystal surface temperature gradient for constant high temperature annealing done at 1000° C.

The dependence of average BMD density resulting from the effect of temperature gradient is believed to be minimally related to annealing temperature. As depicted in FIG. 13, the predicted average BMD density for a 300 mm ingot varied from about $2*10^8$ per $cm^3$ at a crystal surface temperature gradient of about 31 K/cm to about $2.25*10^8$ per $cm^3$ at a crystal surface temperature gradient of about 51 K/cm at an annealing temperature of 1100° C. As depicted in FIG. 14, the predicted average BMD density for a 300 mm ingot varied from about $2.8*10^{10}$ per $cm^3$ at a crystal surface temperature gradient of about 31 K/cm to slightly less than about $2.8*10^{10}$ per $cm^3$ at a crystal surface temperature gradient of about 51 K/cm at an annealing temperature of 1000° C. Although the average BMD density was greater at 1000° C. than at 1100° C., the dependence of average BMD density based on ingot nitrogen concentration was substantially similar at both temperatures.

Combinations of Pull Rate, Surface Temperature Gradient and Nitrogen Concentration In accordance with the present disclosure, it has been discovered that combinations of pull rate, surface temperature gradient and nitrogen concentration affect (i) the radial uniformity of vacancy radius and density as a function of crystal radial location across the crystal cross section, (ii) radial uniformity of BMD diameter and density as a function of crystal radial location across the crystal cross section of thermally treated wafers sliced from the nitrogen-doped CZ silicon crystals, and (iii) edge band characteristics of said wafers. It has been further discovered that combinations of pull rate, surface temperature gradient and nitrogen concentration may be selected to achieve a substantial radial uniformity of BMD diameter and density as a function of crystal radial location across a crystal wafer cross section and a substantial absence of an edge effect. Various algorithms, and combinations thereof, as described herein, have been employed to model (i) the effect of pull rate and temperature gradient on BMD size and density distribution, (ii) the effect of oxygen concentration and nitrogen concentration together with pull rate and temperature gradient on BMD size and density distribution, (iii) the BMD size distribution based on the lumped model, and (iv) the edge band characteristics.

In further accordance with the present disclosure, combinations of pull rate, nitrogen concentration and crystal surface temperature gradient were evaluated by simulation and experimentation in order to derive a set of conditions suitable for the preparation of nitrogen doped CZ silicon crystal ingots characterized by substantial radial uniformity of vacancy radius and density as a function of crystal radial location across the crystal cross section and thermally treated wafers sliced therefrom characterized by substantial radial uniformity of BMD diameter and density as a function of crystal radial location across the crystal cross section, wherein the wafer exhibits the essential absence of an edge effect. More particularly, utilizing the defect simulation models disclosed herein, it is possible to predict the contribution from some key parameters to the agglomeration of vacancies and oxygen clustering in silicon crystals and wafers for a given diameter. In the simulation models, in one embodiment for a 300 mm diameter wafer, the presence of oxygen precipitation band in the vicinity of a silicon wafer at high pull rates of 0.78 to 1.0 mm/min was addressed. This finding corroborates the lateral incorporation of vacancies effect disclosed by Kulkarni (U.S. Pat. No. 8,216,362). The effect of these changes on the average BMD density averaged over lateral cross-section in wafers sliced from as grown crystals after various thermal treatments, which can be simulated as Epi and annealing, is also addressed by the simulations. Based on the simulation results, various combinations of these key parameters were designed and evaluated. The simulation models were used to assess the combined effects of the parameters and to establish a basis from which to test crystal growth and evaluate wafers in order to calibrate the simulation models and to confirm the final results. Several iterations of simulation, calibration, and testing were done in order to achieve radial uniformity of BMD in controlled size and density crystal ingots, polished, and Epi wafers. The simulation results were experimentally validated. It is to be noted that BMD size for purposes of simulation is estimated on the basis of radius, while BMD size in thermally treated or post epi thermally treated wafers is on the basis of diameter.

Based on simulation and experimentation, a correlation between wafer BMD and each the CZ silicon ingot individual parameters including nitrogen concentration, crystal pull rate and temperature gradient has been established. To achieve satisfactory BMD capabilities in polished, Epi, and annealed wafers, interrelationships between the various parameters disclosed herein have been established by simulation models to enable prediction of the outcome of various combinations of the parameters in order to achieve desired and optimized precipitation behavior with uniform radial distribution of BMD in controlled size and density in wafers without substantial edge effect.

Based on simulations and experimental evaluation, a combination of variables sufficient to achieve the objects of the present disclosure has been established. The ranges may suitably vary with ingot diameter. In any of the various aspects of the present disclosure for the preparation of CZ silicon crystal ingots: (1) the nitrogen concentration is from about $1*10^{13}$ atoms per cm$^3$ to about $1*10^{15}$ atoms per cm$^3$; (2) the temperature gradient is from about 10° K per cm to about 50° K per minute, from about 10° K per minute to about 35° K per cm, from about 25° K per cm to about 50° K per cm, from about 30° K per cm to about 50° K per cm, or from about 35° K per cm to about 50° K per cm; and (3) the pull rate is from about 0.4 mm per minute to about 1.5 mm per minute, from about 0.5 mm per minute to about 1.5 mm per minute, from about 0.85 mm per minute to about 1.5 mm per minute, from about 0.7 mm per minute to about 1.0 mm per minute, from about 0.78 mm per minute to about 1.0 mm per minute, from about 0.8 mm per minute to about 1.0 mm per minute, from about 0.85 mm per minute to about 1.0 mm per minute, from about 0.75 mm per minute to about 1.0 mm per minute, or from about 0.9 mm per minute to about 1.0 mm per minute. In some 300 mm diameter CZ silicon crystal ingot aspects, a combination of variables selected from a pull rate of from about 0.85 mm per minute to about 1.5 mm per minute, a temperature gradient of from about 10° K per cm to about 35° K per cm at an average crystal surface temperature of from about 1300° C. to about 1415° C., and a nitrogen concentration of from about $1*10^{13}$ atoms per cm$^3$ to about $1*10^{15}$ atoms per cm$^3$ provides for an ingot having the BMD size and density distributions and edge band characteristics as described herein. In some other such aspects, the pull rate is from about 0.85 mm per minute to about 1.0 mm per minute or form about 0.9 mm per minute to about 1.0 mm per minute. For CZ silicon crystals having a diameter of other than 300 mm, the combination of pull rate range, nitrogen concentration range, and temperature gradient range required to achieve the BMD distribution and edge band objects of the present disclosure may be determined by the simulations disclosed herein wherein the predicted ranges may fall outside, overlap or be encompassed by the ranges required for a 300 mm diameter ingot.

Simulations

Algorithms and simulation methods are disclosed herein that allow for the prediction of a set of pull rate, nitrogen concentration and temperature gradient variables for a given CZ silicon crystal ingot diameter that enable the preparation of nitrogen doped CZ silicon wafers having the radially uniformly distributed BMD diameter and density, and the edge band characteristics disclosed herein.

An algorithm used to model and predict the effect of pull rate and temperature gradient on BMD size and distribution is disclosed by M. S. Kulkarni and V. V. Voronkov, *Simplified Two-Dimensional Quantification of the Grown-in Microdefect Distributions in Czochralski Grown Silicon Crystals*, Journal of the Electrochemical Society, 152 (10) pages G781 to G786 (2005), referenced herein as the "Kulkarni 2005 Algorithm". The disclosed lumped model allows for computationally prediction of BMD distributions in thermally treated wafers. In summary, the microdefects can be approximated as spherical clusters. At an element of a CZ crystal, an equivalent population of identical clusters of the same radius, equal to the average radius of the actual cluster population, represents the actual cluster population. By replacing the average cluster radius by the square root of the average of the squared radii of the clusters, the equations describing the defect dynamics can be computationally simplified. The microdefect distribution is quantified by a set of disclosed equations describing the point defect concentration (C), the cluster density (N), and an auxiliary variable (U) proportional to the surface area of the total cluster population. The cluster density N is predicted by the classical nucleation theory, U is described using the disclosed cluster growth equation, and C by the disclosed equation involving the transport, the recombination, and the consumption by the growing clusters of the point defects. The model is sufficiently accurate to capture the final (grown-in)

spatial distribution of the microdefect density and size and was validated by comparison of the predictions of the model with the predictions of a rigorous model and the experimental observations.

An algorithm used to model and predict the effect of nitrogen concentration, pull rate and temperature gradient on BMD size and distribution is disclosed by M. S. Kulkarni, *Defect dynamics in the presence of nitrogen in growing Czochralski silicon crystals*, Journal of Crystal Growth 310, pages 324 to 335 (2008), referenced herein as the "Kulkarni 2008 Algorithm". The disclosed model approximates all aggregates as spherical clusters. As disclosed by Kulkarni, classical nucleation theory captures the formation of all clusters with a reasonable accuracy. The formed clusters grow by diffusion-limited kinetics. Vacancy clusters and self-interstitial clusters are formed by the homogeneous nucleation of vacancies and self-interstitials, respectively. Oxygen clusters, because of their higher specific volume, are formed by the facilitation by vacancies. The growth of oxygen clusters is limited by the diffusion of oxygen when vacancies are in abundance and by the diffusion of vacancies when vacancies are scarce. The population of clusters at a given location in a growing crystal is approximated by an equivalent population of identical clusters. The model quantifies the conditions leading to the formation of different microdefects in CZ crystal growth. The effects of varying pull-rate and the nitrogen concentration are also captured. The model quantifies the microdefect distributions in CZ crystals growing under both steady states as well as unsteady states. The disclosed model predictions agree well with the reported microdefect distributions in the presence nitrogen in low to moderately high concentrations. In the presence of nitrogen in very high concentrations (on the order of $10^{18}$ cm$^{-3}$ or more), however, the model predictions are less accurate.

An algorithm used to model and predict the effect of oxygen concentration, pull rate and temperature gradient on BMD size and distribution is disclosed by M. S. Kulkarni, *Defect dynamics in the presence of oxygen in growing Czochralski silicon crystals*, Journal of Crystal Growth 303, pages 438 to 448 (2007), referenced herein as the "Kulkarni 2007 Algorithm". The disclosed model quantifies the distributions of microdefects in growing CZ crystals can be accomplished by treating reactions involving the intrinsic point defects of silicon and oxygen, along with the formation and growth of microdefects. The presence of oxygen primarily generates two bound vacancy species, vO and vO2, and aggregates of oxygen. The aggregates of vacancies are modeled as spherical v-clusters; the aggregates of self-interstitials are modeled as spherical i-clusters; and the aggregates of oxygen, primarily silicon dioxide, are modeled as spherical O-clusters. The complexity of this treatment is reduced by the application of the lumped model developed by Kulkarni and Voronkov, (*Simplified Two-Dimensional Quantification of the Grown-in Microdefect Distributions in Czochralski Grown Silicon Crystals*, Journal of the Electrochemical Society, 152 (10) pages G781 to G786 (2005)) that approximates a population of clusters of different sizes at any given location in a CZ crystal as an equivalent population of identical clusters. The key element of the disclosed model is the vacancy assisted formation of O-clusters. Effectively, all large O clusters in the CZ growth are formed by absorbing vacancies, as the specific volume of O-clusters is greater than that of silicon. The growing O-clusters directly consume only free vacancies (v); as the free vacancy concentration decreases, however, more free vacancies are generated by the disassociation of vO and vO2 species. Thus, both free vacancies and vacancies bound in vO and vO2 species are consumed.

The disclosed model quantifies the microdefect distributions in CZ crystals growing under steady states as well as unsteady states. It is believed that the type of microdefect formed in a given region in the crystal depends on the concentration of the intrinsic point defects and of vO and vO2 species established a short distance away from the interface. In the regions marked by a high free vacancy concentration, voids or v-clusters are formed at higher temperatures by the nucleation of vacancies. The v-cluster growth consumes both free and bound vacancies. In the regions marked by a moderate free vacancy concentration, v-cluster formation is suppressed at higher temperatures; free and bound vacancies are consumed by the formation and growth of O-clusters. The binding between vacancies and oxygen allows survival of vacancies in the bound form in very low concentrations at lower temperatures even in the presence of v-clusters and O-clusters. In the regions marked by the dominance of self-interstitials, i-clusters are formed.

The concentration fields of the intrinsic point defects in the vicinity of the interface is believed to be established primarily by the interplay between the Frenkel reaction and the intrinsic point defect transport. Oxygen increases the effective vacancy concentration available for the recombination with self-interstitials by increasing the concentration of vO and vO2 species and marginally aids the conditions leading to the survival of vacancies as the dominant intrinsic point defect species, for fixed crystal growth conditions. The increase in the pull-rate range within which crystals free of large v-clusters and i-clusters can be grown, with increasing oxygen concentration, is also predicted and explained by the model. This behavior is caused by an increase in the concentration of bound vacancies with increasing oxygen concentration, for fixed crystal growth conditions. Qualitative microdefect distributions in CZ crystals reported in the literature can be quantified by the developed model.

An algorithm used to model and predict the BMD size distribution based on the lumped model is disclosed by G. Samanta and M. S. Kulkarni, *Efficient computation of population distribution of microdefects at any location in growing Czochralski silicon single crystals*, Journal of Crystal Growth, 393, pages 49 to 53 (2014), referenced herein as the "Samanta Algorithm". The disclosed model is based on the model described in M. S. Kulkarni and V. V. Voronkov (*Simplified Two-Dimensional Quantification of the Grown-in Microdefect Distributions in Czochralski Grown Silicon Crystals*, Journal of the Electrochemical Society, 152 (10) pages G781 to G786 (2005)) and allows for calculation of size distribution of microdefect population at any location in the crystal without taking cluster formation and path (migration) energies into account. The dependences of thermal stress and dopant concentration are also not taken into account. The dopant-induced strain effect on intrinsic point defect equilibrium concentrations is negligibly small for conventional doping levels. The change in equilibrium values of point defect concentrations due to dopant-induced shift in the Fermi level is also significant only at very high doping levels (of the order of $10^{18}$ cm$^{-3}$ or more). The impact of thermal stress on equilibrium concentration values is also small. The computational advantage of the lumped model is not compromised when the point defect concentration field evolved through it is also used to solve for the size distribution of microdefect populations at chosen locations in the crystal. The size distributions predicted from lumped model agree reasonably well with those predicted from rigorous model under steady as well as unsteady conditions.

Figure 23:
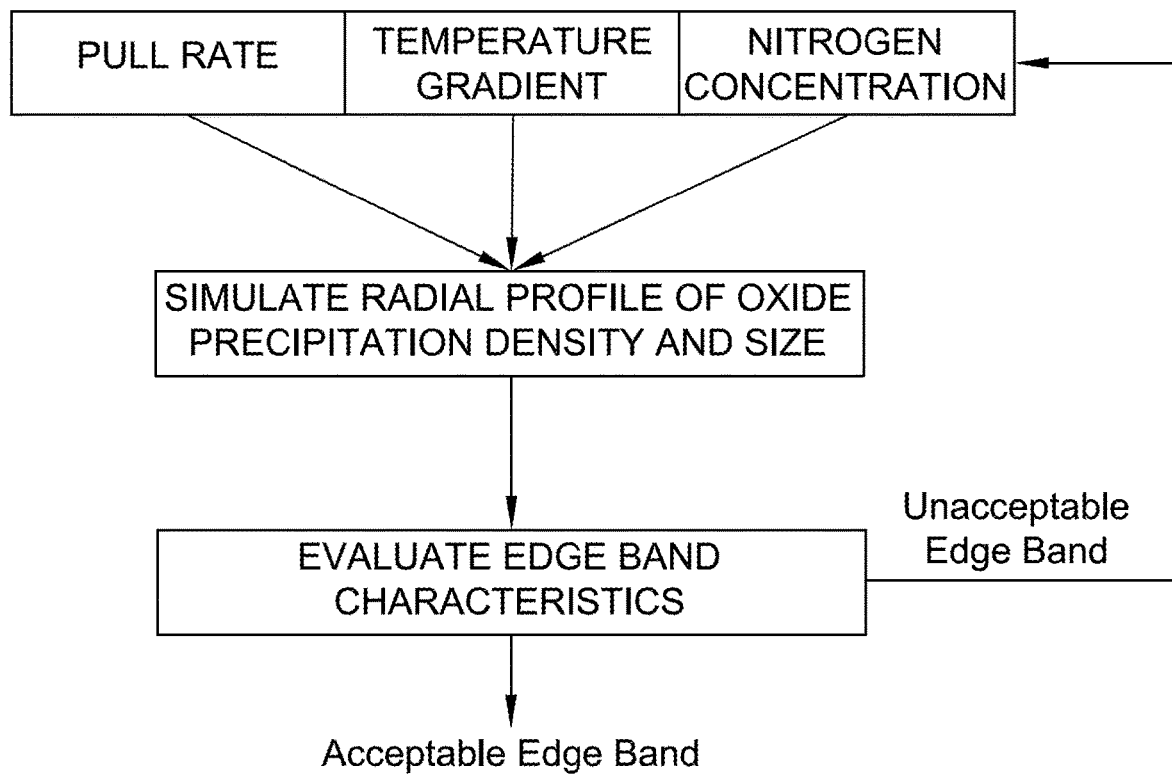
FIG. 23 is a flow chart for one method of the present disclosure for simulating and evaluating edge band bulk micro defect size and density.

In accordance with the present disclosure, a method has been developed based on the above-described algorithms for deriving pull rate, temperature gradient and nitrogen concentration values enabling the preparation of single crystal CZ silicon characterized by substantial radial uniformity of vacancy radius and density as a function of crystal radial location across a crystal cross section, by substantial radial uniformity of BMD diameter and density as a function of crystal radial location across a crystal cross section, and by the substantial absence of an edge effect has been developed. One such embodiment is depicted in the FIG. 23 flow chart. In summary, The Kulkarni 2005, Kulkarni 2007, and Kulkarni 2008 algorithms are used in combination with the Samanta algorithm to simulate the radial profile of oxide precipitate density and size and to evaluate the edge band characteristics of single crystal CZ silicon ingots and wafers. For any given set of pull rate, temperature gradient and nitrogen concentration variables, silicon crystals ingots or wafers are deemed to be unacceptable if they are predicted by simulation to fail because of (i) an increase in radial bulk micro defect size in a region extending from the center of the ingot or wafer to the edge of the ingot or wafer of greater than 20%, (ii) an increase in radial bulk micro defect density in a region extending from the center of the ingot or wafer to the edge of the ingot or wafer of greater than 200%, (iii) an increase in radial bulk micro defect size in a region extending from about 10 mm to the edge of the ingot or wafer to the edge of the ingot or wafer of greater than 15%, (iv) an increase in radial bulk micro defect density in a region extending from about 10 mm to the edge of the ingot or wafer to the edge of the ingot or wafer of greater than 100%, and (v) an edge band in a region extending from about 1000 µm to the edge of the ingot or wafer and the edge of the ingot or wafer wherein the edge band comprises oxygen precipitates having an average radius of less than about 30 nm or greater than about 100 nm and an oxygen precipitation density of less than about $1*10^8$ atoms per cm$^3$ or greater than about $1*10^{10}$ atoms per cm$^3$. If a set of variables is predicted to result in an unacceptable ingot or wafer, then a subsequent simulation iteration is done based on a new set of variables. Simulation iterations are continued until a set of variables is derived that is predicted to provide the desired BMD size and distribution.

In some further aspects of the present disclosure, the BMD size may be predicted from simulation. First, the cluster size distribution of oxygen precipitates is calculated at a number of radial locations across the crystal cross-section at an axial position. Next, a critical size ($R_{cr}$) is determined based on classical nucleation theory (CNT) as follows:

$$R_{cr}=(2215)/(T \ln(C_O/C_{Oe})) \tag{1}$$

In equation (1), $R_{cr}$ is in nanometers (nm); T denotes the annealing temperature in degrees Kelvin; $C_O$ denotes oxygen level in the crystal; and $C_{Oe}$ denotes the equilibrium value of oxygen concentration in silicon crystal at the temperature T. Density of oxygen precipitates with sizes greater than $R_{cr}$ is integrated at every location and then number averaged over all those locations to estimate the BMD density.

The present disclosure is further directed to methods for simulating oxide precipitation density across the wafer depth during annealing. The mathematical model for the simulation is based on the nucleation model of Voronkov and Falster (*Nucleation of oxide precipitates in vacancy-containing silicon*, Journal of Applied Physics, Volume 51, pages 5802-5810 (2002)) wherein the following equations are believed to govern the point defect balance, interaction between vacancy and oxygen, and the growth of precipitates. The equations are as follows:

$$\partial(C_{vt}-C_i)/\partial t=D_v(T)\partial x^2 C_v/\partial x^2-D_i(T)\partial^2 C_i/\partial x^2-J_i \tag{2}$$

Equation (2) describes the balance of point defects accounting for the bound as well as free states of vacancies, diffusion fluxes of point defects and emission flux of self-interstitials due to the growing oxide precipitates. The consumption flux of free vacancies can be neglected as it estimated to be less than the diffusion-limited value.

$$J_i=\varepsilon 4\pi DCfI_s(t')R(t',t)dt' \tag{3}$$

Equation (3) gives the quantitative evaluation of the emission flux of self-interstitials.

$$R(t',t)=[2DC(t-t')/q]^{1/2} \tag{4}$$

Equation (4) describes the diffusion limited growth of nucleated oxide precipitates.

$$C_i C_{vt}=C_{ie}C_{vte} \tag{5}$$

Equation (5) is a result of the reasonable assumption of fast reaction between bound as well as free vacancies and self-interstitials.

$$C_v/C_{vt}=C_{ve}/C_{vte} \tag{6}$$

Equation (6) arises from the assumption that free vacancies are quickly captured by the oxygen clusters.

Figure 19:
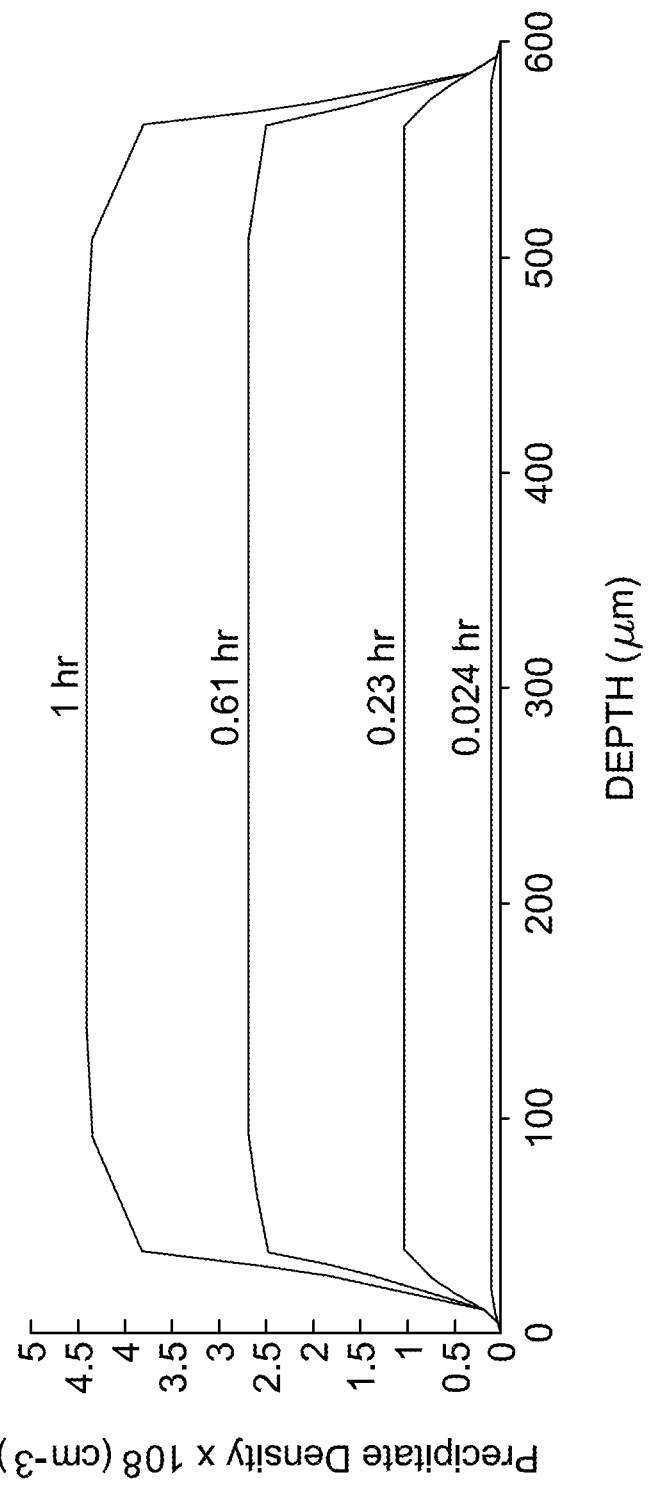
FIG. 19 is a graph showing the predicted oxide precipitate density across the depth of a wafer without nitrogen doping at times 0.024 hour, 0.23 hour, 0.51 hour and 1 hour for annealing at 800° C. with an initial total vacancy concentration ($C_{vt}$) of $6*10^{12}$ numbers per $cm^3$ and an oxygen concentration ($C_O$) of $8*10^{17}$ atoms per $cm^3$.
Figure 20:
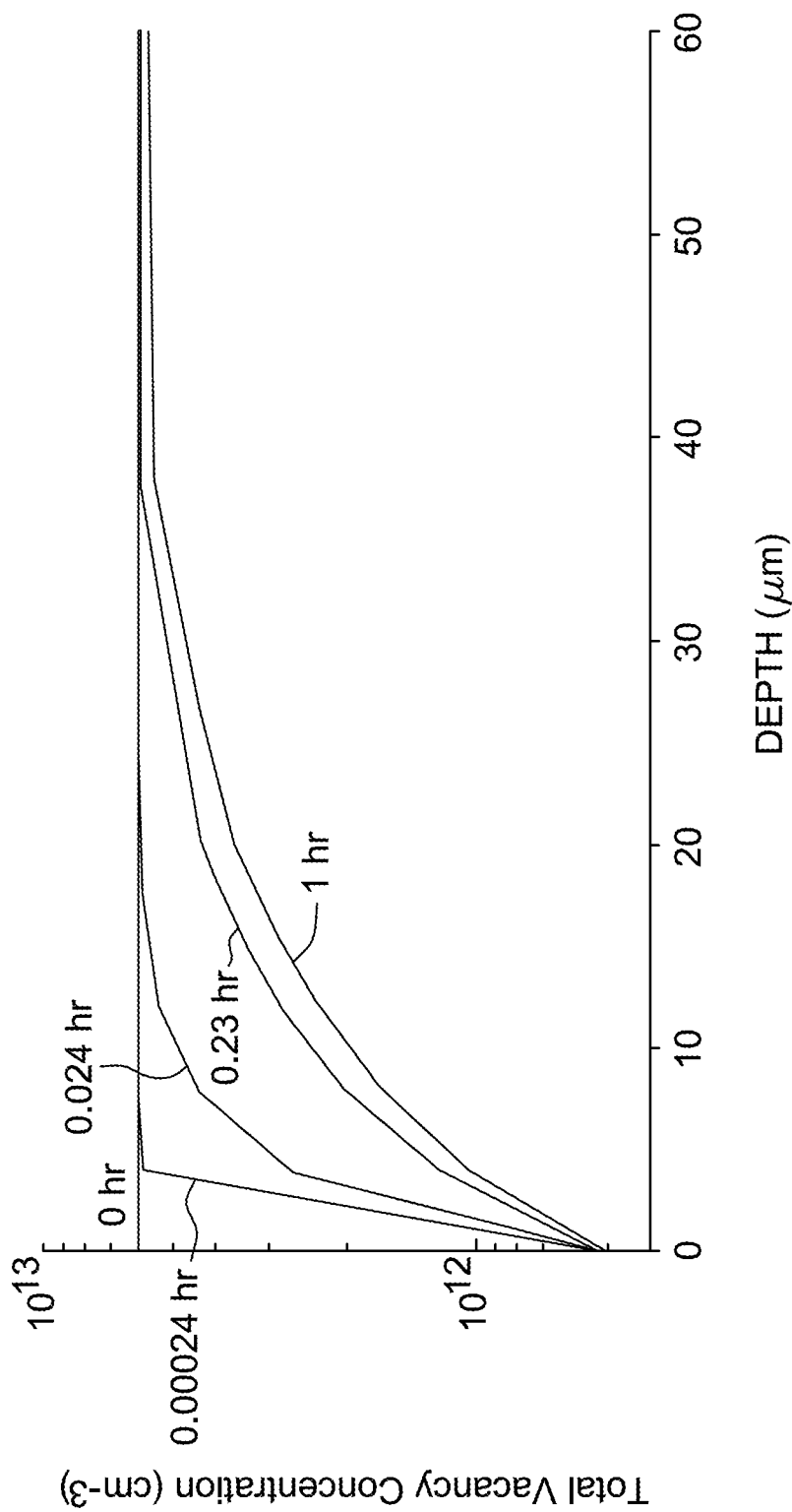
FIG. 20 is a graph showing the predicted total vacancy concentration in number per $cm^3$ across the depth of a wafer without nitrogen doping at times 0.024 hour, 0.23 hour, 0.51 hour and 1 hour for annealing at 800° C. with an initial total vacancy concentration ($C_{vt}$) of $6*10^{12}$ numbers per $cm^3$ and an oxygen concentration ($C_O$) of $8*10^{17}$ atoms per $cm^3$.

Simulations of annealing a wafer of 600 micron thickness containing $8*10^{17}$ oxygen atoms per cm$^3$ and an initial total vacancy concentration ($C_{vt}$) of $6*10^{12}$ numbers per cm$^3$ at 800° C. for 1 hour were done. The selected $C_{vt}$ value is considered to be a typical value for vacancy dominated wafers as measured using Pt diffusion technique. FIG. 19 is a graph of the predicted oxide precipitate density across the wafer depth at various times during annealing. FIG. 20 is a graph of predicted $C_{vt}$ across the wafer depth at various times during annealing. FIGS. 19 and 20 show the changes that happen close to the wafer surface due to the presence of equilibrium conditions on the surface. The total vacancy concentration out-diffuses from the bulk towards the wafer surface causing the precipitate density to also decay away from the bulk. At a depth of about 30 to 40 microns from the wafer surface, precipitate density remains low compared to the bulk value.

Silicon wafers of the present disclosure may be used in a variety of applications. For example, such wafers having a bare silicon surface polished to a specular finish (i.e., a polished wafer) may be used directly in an integrated circuit manufacturing process. Alternatively, the wafer may be used as a substrate for epitaxial deposition or silicon on insulator ("SOI") (by layer transfer or oxygen implantation). If desired, the near-surface region of the wafers, e.g., generally up to about 2 micrometers, may be substantially, or even entirely, removed by chemical etching using etchants and techniques conventional in the art. If desired, the wafer may be chemically or chemomechanically polished to a specular finish prior to or after oxygen precipitation. The epitaxial layer may be deposited onto the entire wafer, or, alternatively, onto only a portion of the wafer. The epitaxial layer preferably is deposited onto the front surface of the wafer. More preferably, it is deposited onto the entire front surface of the wafer. Whether it is preferred to have an epitaxial layer deposited onto any other portion of the wafer will depend on the intended use of the wafer. For most applications, the existence or nonexistence of an epitaxial layer on any other portion of the wafer is not critical.

A silicon on insulator structure generally comprises a device layer, a handle wafer or supporting layer, and an insulating film or layer (typically an oxide layer) between the supporting layer and the device layer. Generally, the device layer is between about 0.5 and 20 micrometers thick. Silicon on insulator structures may be prepared using various techniques known in the art, such as SIMOX or BESOI. SOI structures may be prepared, for example, by the SIMOX process by subjecting the wafer to an ion implantation process which is standard in the art. (See, e.g., U.S. Pat. No. 5,436,175 and Plasma Immersion Ion Implantation for Semiconductor Processing, Materials Chemistry and Physics 46 (1996) 132-139, both of which are incorporated herein by reference). SOI structures may also be prepared by bonding two wafers and removing a portion of one of the bonded wafers. For example, SOI structures can be prepared by the BESOI process, wherein the wafer is bonded to another wafer, and then a substantial portion of one of the wafers is etched away using known wafer thinning techniques to obtain the device layer. (See, e.g., U.S. Pat. Nos. 5,024,723 and 5,189,500 which are incorporated herein by reference.)

The epitaxial deposition preferably is carried out by chemical vapor deposition. Generally speaking, chemical vapor deposition involves exposing the surface of the wafer to an atmosphere comprising silicon in an epitaxial deposition reactor, e.g., a Centura reactor available from Applied Materials. Preferably, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (preferably $H_2$). For example, the source of silicon during the epitaxial deposition may be $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the temperature of the wafer surface preferably is ramped to and maintained at a temperature sufficient to prevent the atmosphere comprising silicon from depositing polycrystalline silicon on the surface. Generally, the temperature of the surface during this period preferably is at least about 900° C. More preferably, the temperature of the surface is maintained in the range of between about 1050 and about 1150° C. Most preferably, the temperature of the surface is maintained at the silicon oxide removal temperature. The rate of growth of the epitaxial deposition preferably is from about 0.5 to about 7.0 µm/min. A rate of about 3.5 to about 4.0 µm/min may be achieved, for example, by using an atmosphere consisting essentially of about 2.5 mole % $SiHCl_3$ and about 97.5 mole % $H_2$ at a temperature of about 1150° C. and an absolute pressure of up to about 1 atm.

In some applications, the wafers comprise an epitaxial layer which imparts electrical properties. In some embodiments, the epitaxial layer is lightly doped with phosphorous. Therefore, the ambient for epitaxial deposition comprises phosphorous present as a volatile compound, such as, for example, phosphine, $PH_3$. In some embodiments, the epitaxial layer can contain boron. Such a layer may be prepared by, for example, including $B_2H_6$ in the atmosphere during the deposition. Epitaxial deposition typically requires a post epi cleaning step following epitaxial deposition to remove byproducts formed during the epitaxial deposition. This step is used to prevent time dependent haze, which results if such byproducts react with air. In addition, many post epi cleaning techniques tend to form a silicon oxide layer on the epitaxial surface which tends to passivate (i.e., protect) the surface. The epitaxial wafers of the present disclosure may be cleaned by methods known in the art.

The wafer surfaces may comprise an oxide or nitride layer. For example, a silicon oxide layer forms on a silicon surface when it is exposed to air at room temperature and generally has a thickness of from about 10 to about 15 Å. Preferably, the nitride, oxide, or nitride/oxide layer is removed from the surface of the wafer before the epitaxial layer is deposited onto the surface. Removal of a silicon oxide or nitride/oxide layer may be accomplished by heating the surface of the wafer in an oxidant free atmosphere until the oxide or nitride/oxide layer is removed from the surface. For example, the surface of the wafer is preferably heated to a temperature of at least about 1100° C., and more preferably to a temperature of at least about 1150° C. This heating preferably is conducted while exposing the surface of the wafer to an atmosphere comprising $H_2$ or a noble gas (e.g., He, Ne, or Ar). More preferably, the atmosphere comprises $H_2$. Most preferably, the atmosphere consists essentially of $H_2$ because use of other atmospheres tends to cause etch pits to form in the surface of the wafer. Generally, it is preferable to heat the wafer surface to remove the silicon oxide or nitride/oxide layer and then initiate silicon deposition less than 30 seconds (more preferably within about 10 seconds) after the oxide or nitride/oxide is removed. Generally, this may be accomplished by heating the wafer surface to a temperature of at least about 1100° C. (more preferably at least about 1150° C.) and then initiating the silicon deposition less than 30 seconds (more preferably within about 10 seconds) after the wafer surface reaches that temperature. Waiting to initiate silicon deposition for up to about 10 seconds after removal of the silicon oxide or nitride/oxide layer allows the temperature of the wafer to stabilize and become uniform.

Alternatively, the oxide or nitride/oxide layer may be chemically stripped. In embodiments where the silicon surface has a nitride/oxide layer, chemical stripping is the preferred means for removing the nitride/oxide layer. Chemical stripping may be done by means known in the art using phosphoric acid, hydrofluoric acid, or other acids as are known. In another alternative, the oxide or nitride/oxide layer may be etched by plasma etching, using, for example, eMAX from Applied Materials, or other methods as are known in the art. In embodiments where the surface layer is predominantly a silicon nitride layer, the nitride layer may be removed by polishing, chemical etching, or plasma etching (such as eMAX from Applied Materials, or other etching methods as are known in the art).

EXAMPLES

Example 1

Simulations were done to derive a set of variables that enable the preparation of 300 mm diameter wafers sliced from nitrogen-doped single crystal silicon ingots wherein the wafers are characterized by substantial radial uniformity of BMD size and distribution. The simulations were based on method depicted in FIG. 23 for the combination of variables disclosed in Table 1 wherein "Comb" refers to combination, "Prior Art" is a comparative prior art ingot. The nitrogen concentration in Table 1 refers to concentration in the silicon melt, wherein the nitrogen concentration in a formed silicon crystal is expected to be in the range of from about $1*10^{13}$ atoms per cm$^3$ to about $1*10^{15}$ atoms per cm$^3$.

TABLE 1

| Comb. | Pull Rate (mm/min) | Nitrogen (atoms/cm$^3$) | Crystal Surface Temperature Gradient (K/cm) |
|---|---|---|---|
| Prior Art | 0.85 | $1.26*10^{17}$ | 51.14 |
| 1 | 0.9 | $1.76*10^{17}$ | 46.04 |
| 2 | 0.9 | $1.26*10^{17}$ | 46.04 |
| 3 | 0.9 | $1.76*10^{17}$ | 35.84 |
| 4 | 0.9 | $1.26*10^{17}$ | 35.84 |

Figure 15:
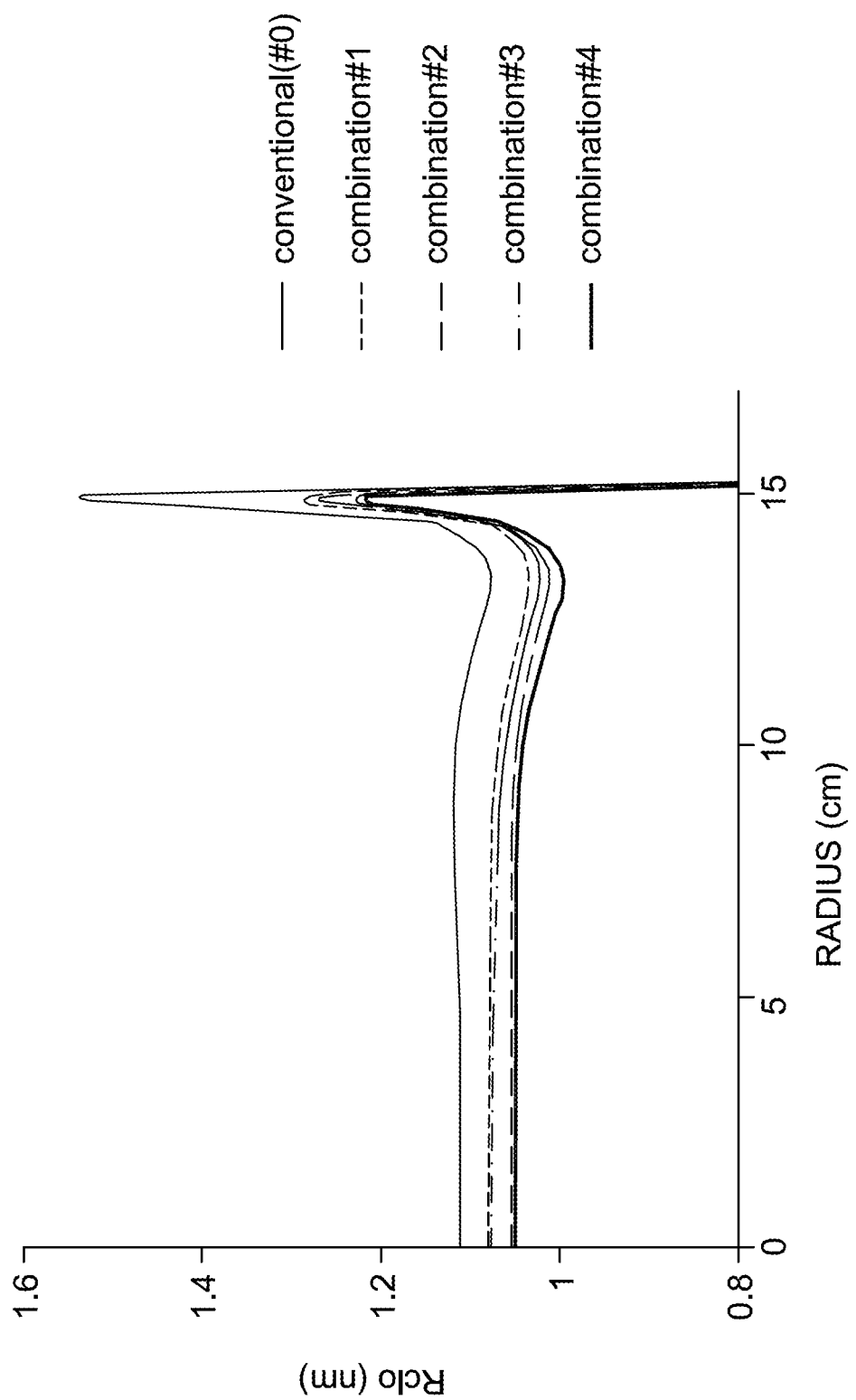
FIG. 15 is a graph showing the predicted radii of as-grown oxygen precipitates as a function of radial location across a crystal cross-section for nitrogen doped 300 mm diameter CZ crystals of the present disclosure (combinations 1-4) and for a prior art nitrogen doped 300 mm diameter CZ crystal (conventional (#0)).
Figure 16:
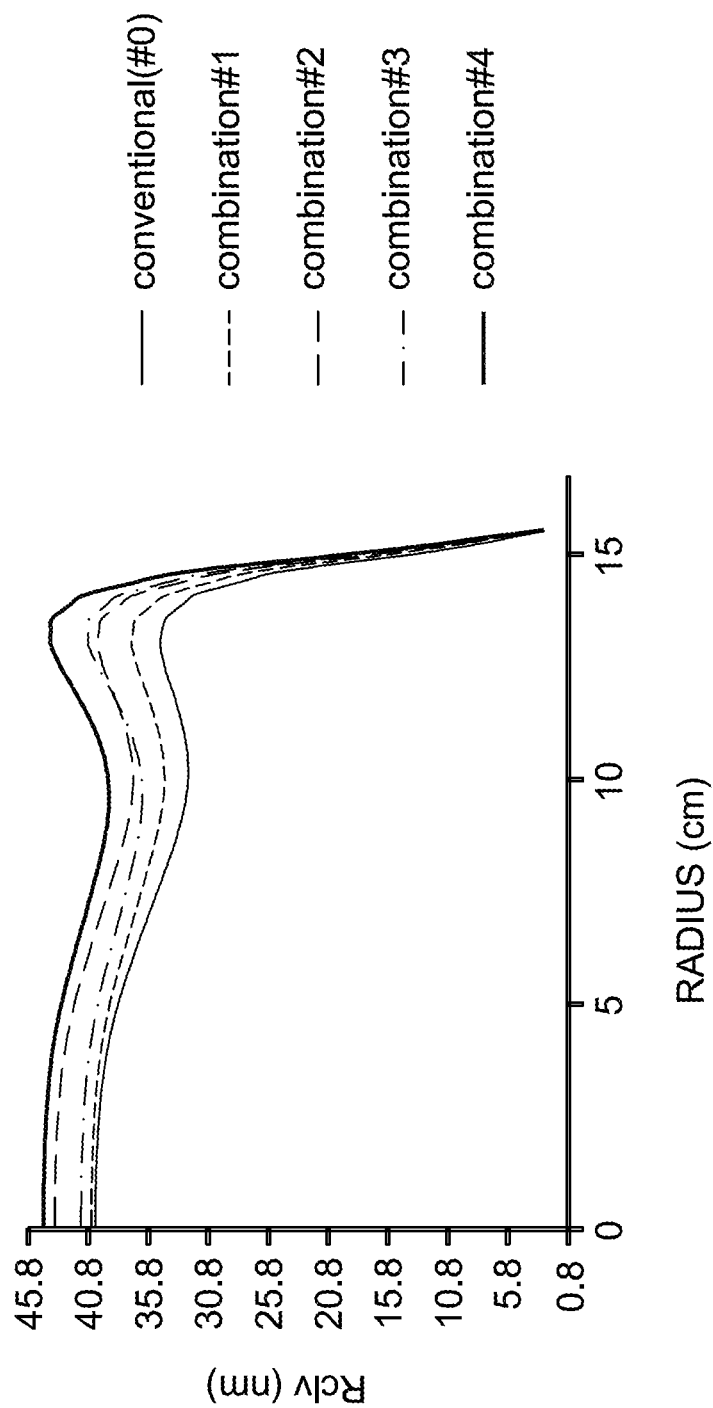
FIG. 16 is a graph showing the predicted radii of as-grown voids as a function of radial location across a crystal cross-section for nitrogen doped 300 mm diameter CZ crystals of the present disclosure (combinations 1-4) and for a prior art nitrogen doped 300 mm diameter CZ crystal (conventional (#0)).

The radii of as-grown oxygen precipitates and radii of as-grown voids at various locations across the wafer cross section from the central axis to the edge was predicted using the simulation method disclosed herein. FIG. 15 is a graph showing the predicted radii of as-grown oxygen precipitates as a function of radial location across a wafer cross-section and FIG. 16 is a graph showing the predicted radii of as-grown voids as a function of radial location across a wafer cross-section. Table 2 below presents the FIG. 15 simulation results in table form for the predicted BMD size percent increase (i) from the center of the wafer to the edge of the wafer and (ii) from 10 mm to the edge of the wafer.

TABLE 2

| Comb. | % Oxygen precipitate size increase from the center of the ingot to the edge of the ingot | % Oxygen precipitate size increase from 10 mm to edge of the ingot and the edge of ingot |
|---|---|---|
| 0 | 39% | 34% |
| 1 | 18% | 23% |
| 2 | 20% | 20% |
| 3 | 12% | 15% |
| 4 | 17% | 15% |

Figure 17:
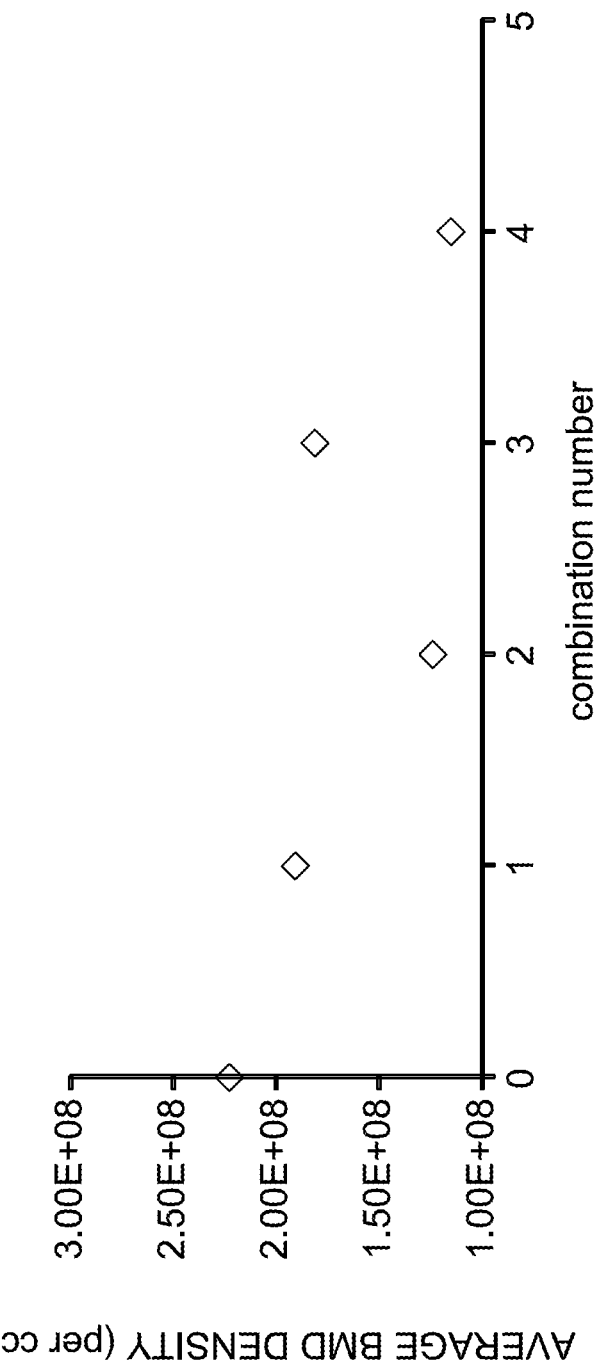
FIG. 17 is a graph showing the predicted average BMD density as a function of crystal surface temperature gradient for constant high temperature annealing done at 1100° C. for nitrogen doped 300 mm diameter CZ crystals of the present disclosure and for a prior art a nitrogen doped 300 mm diameter CZ crystal.
Figure 18:
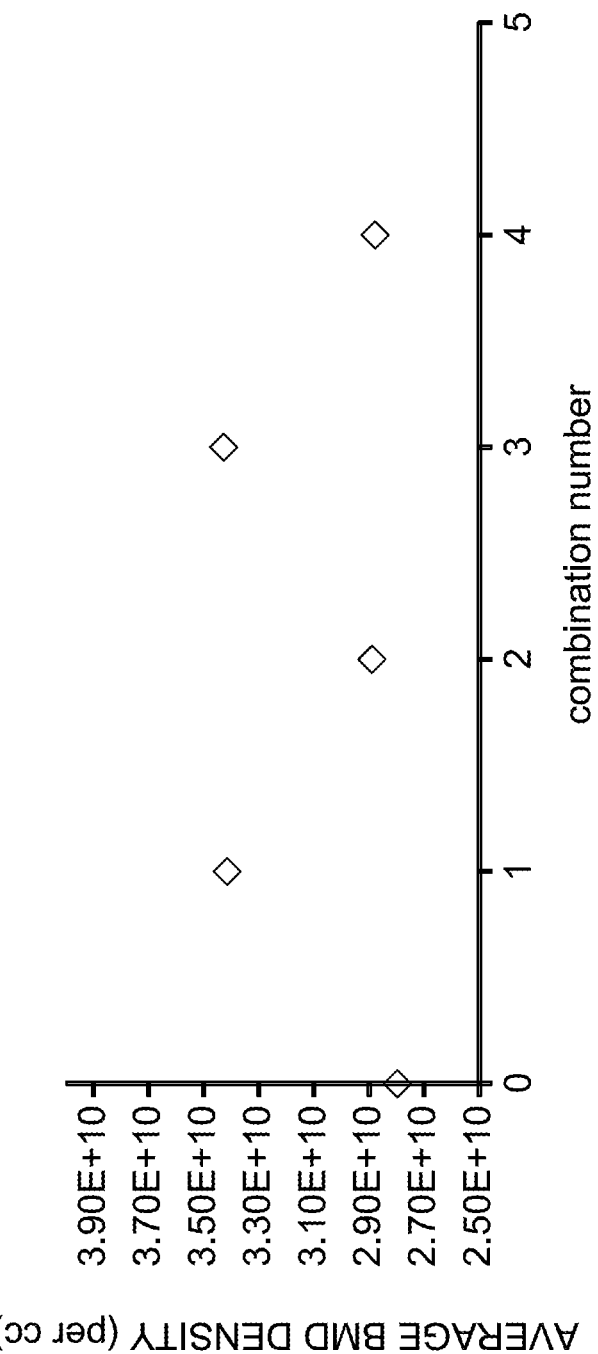
FIG. 18 is a graph showing the predicted average BMD density as a function of crystal surface temperature gradient for constant high temperature annealing done at 1000° C. for nitrogen doped 300 mm diameter CZ crystals of the present disclosure and for a prior art a nitrogen doped 300 mm diameter CZ crystal.

BMD density in wafers resulting from high temperature annealing at 1100° C. and 1000° C. was predicted based on simulation. The simulation results are depicted in FIGS. 17 and 18 where combination 0 refers to the prior art combination. FIG. 17 is a graph showing the predicted average BMD density for wafers as a function of crystal surface temperature gradient for constant high temperature annealing done at 1100° C. and FIG. 18 is a graph showing the predicted average BMD density for wafers as a function of crystal surface temperature gradient for constant high temperature annealing done at 1000° C.

Example 2

Three 300 mm diameter single crystal CZ silicon ingots (designated as uniform samples 1, 2 and 3) were each prepared at a pull rate of 0.9 mm per minute, at a temperature gradient of from about 35° K per cm to about 46° K per cm, and at an ingot nitrogen concentration of from about $1*10^{14}$ atoms per cubic centimeter to about $1*10^{15}$ atoms per cubic centimeter. Comparative 300 mm diameter single crystal CZ silicon ingots (designated as non-uniform samples 1 and 2) were each prepared at a pull rate of 0.78 mm per minute, at a temperature gradient of about 51° K per cm, and at an ingot nitrogen concentration of from about $3*10^{13}$ atoms per cubic centimeter to about $2*10^{14}$ atoms per cubic centimeter. Wafers were sliced from the ingots and were subjected to an oxygen precipitation heat treatment by annealing the wafer for 3 hours at 780° C. and then 16 hours at 1000° C.

Figure 2:
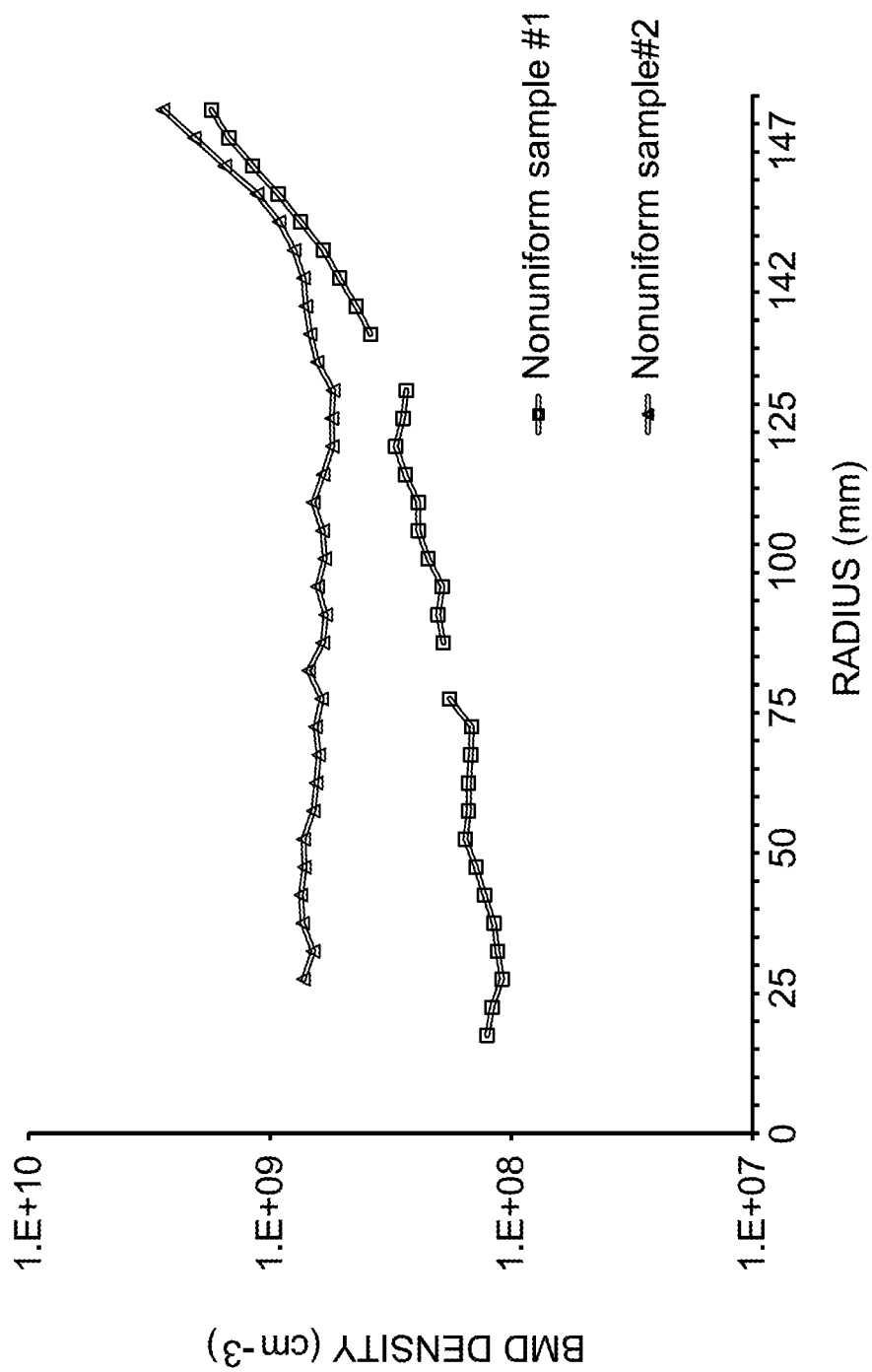
FIG. 2 is a graph showing the radial BMD density profile distribution for prior art nitrogen doped 300 mm diameter thermally treated wafers sliced from CZ crystal depicting increased BMD density at the crystal edge.

As depicted in FIG. 1 the average BMD size (diameter) increase from the center of the wafer to the edge of the wafer was about 47% and about 37% for non-uniform prior art samples 1 and 2, respectively. The averaged BMD size increase from 10 mm to the edge and the edge of the wafer was about 28% and about 29% within the 10 mm radius for non-uniform prior art samples 1 and 2, respectively. As depicted in FIG. 2, the average BMD density increase from the center of the wafer to the edge of the wafer was about 660% and about 285% for non-uniform prior art samples 1 and 2, respectively. The averaged BMD density increase from 10 mm to the edge of the wafer and the edge of the wafer was about 357% and about 308% within the 10 mm radius for non-uniform prior art samples 1 and 2, respectively. The edge band was characterized by a band of precipitations with relatively higher density and relatively large size.

Figure 21:
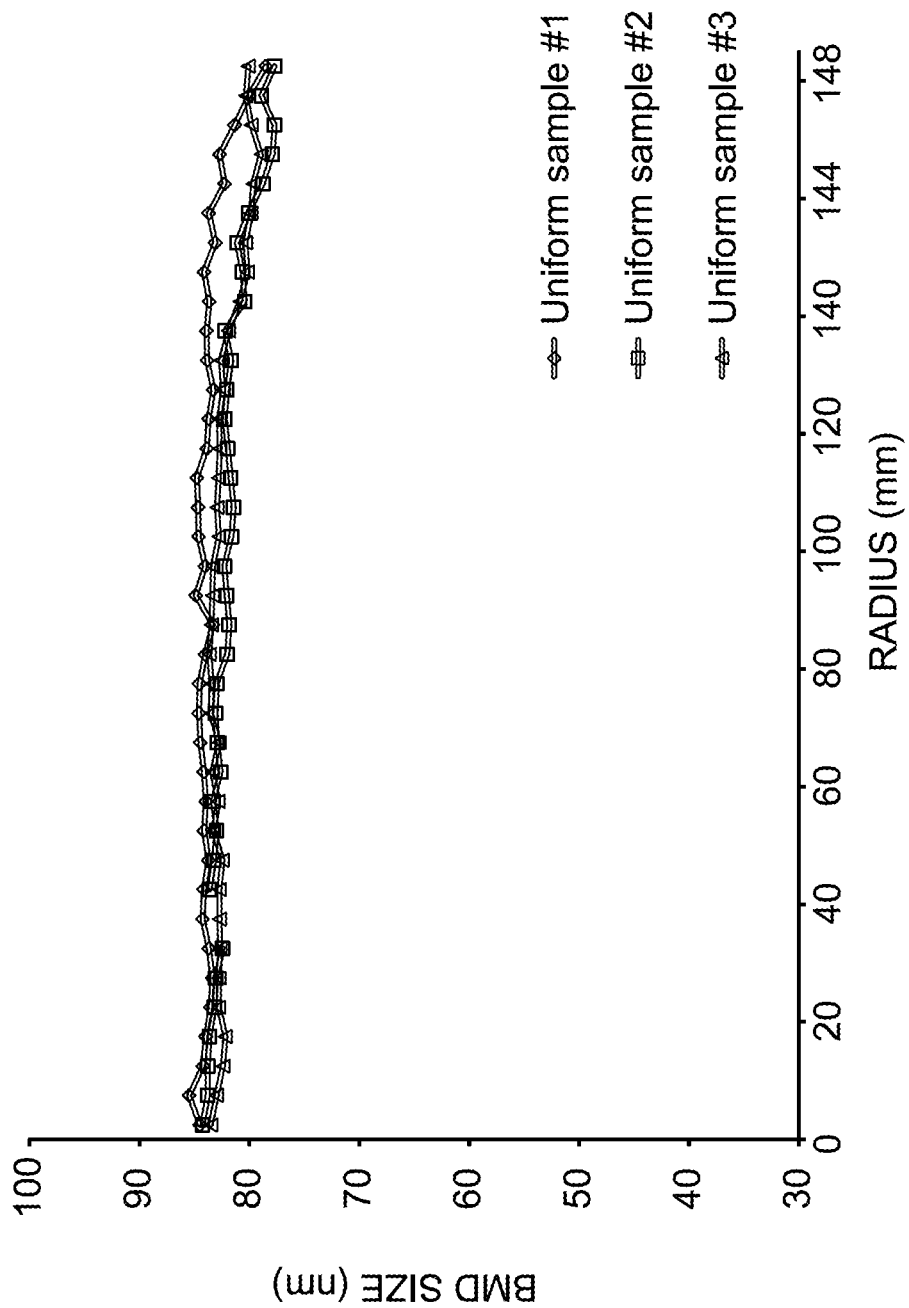
FIG. 21 is a graph showing the average BMD size (diameter) as a function of radial location across a crystal cross-section for nitrogen doped 300 mm diameter thermally treated wafers sliced from CZ crystals of the present disclosure.
Figure 22:
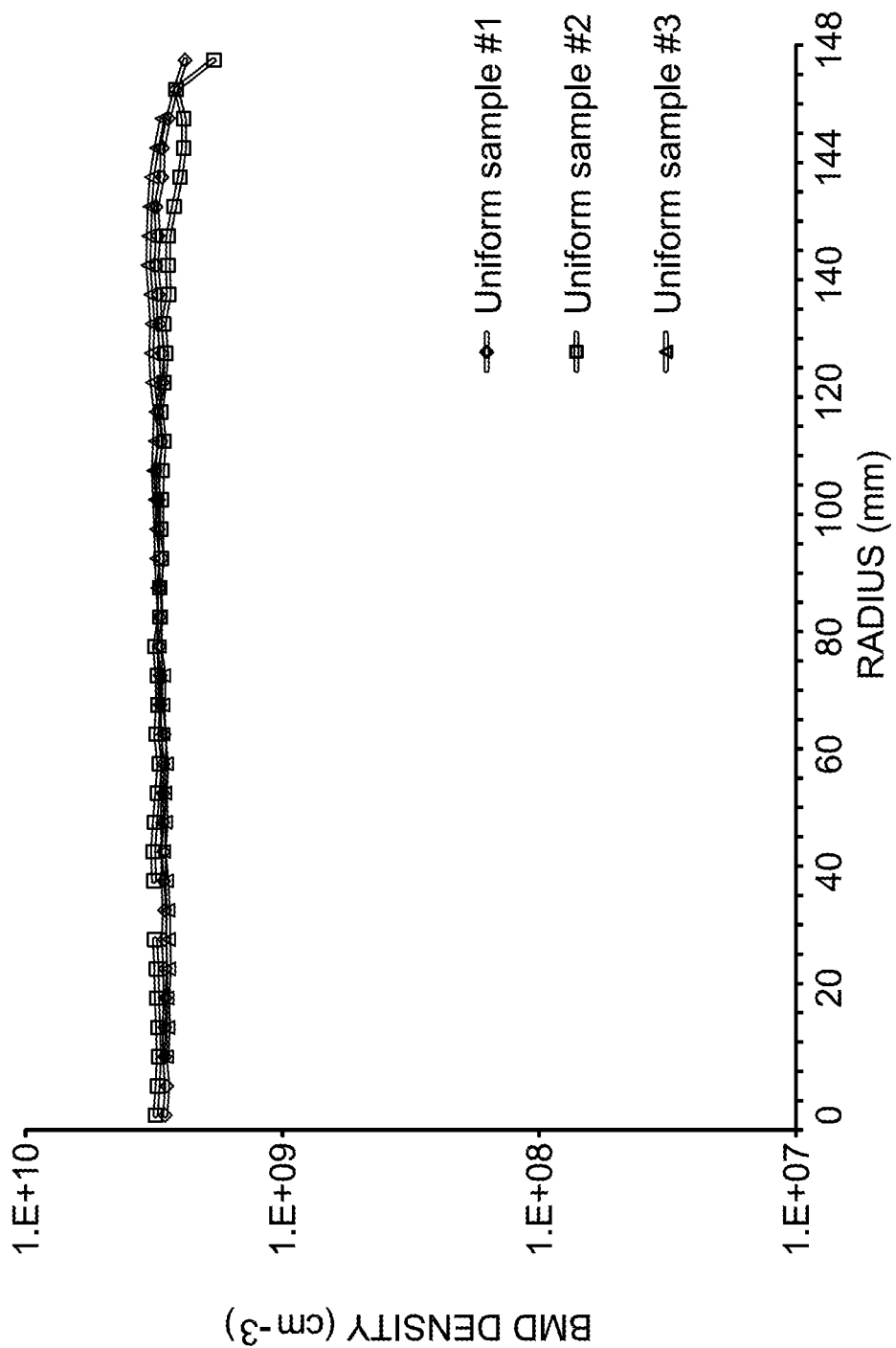
FIG. 22 is a graph showing the BMD density profile as a function of radial location across a crystal cross-section for nitrogen doped 300 mm thermally treated wafers sliced from diameter CZ crystals of the present disclosure.

As depicted in FIG. 21 the average BMD size decrease from the center of the wafer to the edge of the wafer was about 6%, 7% and 4% for uniform samples 1, 2 and 3 of the present disclosure, respectively. The average BMD size decrease from the center of the wafer to the edge of the wafer was about 6%, 3% and 1% for uniform samples 1, 2 and 3 of the present disclosure, respectively. As depicted in FIG. 22, the average BMD density decrease from the center of the wafer to the edge of the wafer was about 23%, 37% and 4% for uniform samples 1, 2 and 3 of the present disclosure, respectively. As depicted in FIG. 22, the average BMD density decrease from the center of the wafer to the edge of the wafer was about 6%, 12% and 16% for uniform samples 1, 2 and 3 of the present disclosure, respectively. There was no detectable edge band in these uniform samples because of the decreases in both density and size.

The results of the experiment demonstrate that through simulations of several combinations, that the radii of oxygen precipitates in the edge region of a conventional process can be reduced significantly without any significant change void size. If annealing is done at 1100° C. then average BMD densities can also be reduced, while still keeping the density above $1*10^8$ per cm$^3$, which has been shown in prior art to be sufficient for gettering.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

What is claimed is:

1. A method of producing a nitrogen-doped CZ silicon crystal ingot, the method comprising:
   pulling the silicon crystal ingot from molten silicon at a pull rate of from 0.85 mm per minute to about 1.5 mm per minute during growth of a substantially constant diameter region of the silicon crystal ingot thereby forming the nitrogen-doped CZ silicon crystal ingot, wherein the nitrogen-doped CZ silicon crystal ingot has a surface temperature gradient of from about 10° K per cm to about 35° K per cm at an average crystal surface temperature of from about 1300° C. to about 1415° C., and wherein the silicon crystal ingot has a nitrogen concentration of from about $1*10^{13}$ atoms per $cm^3$ to about $1*10^{15}$ atoms per $cm^3$;
   wherein a wafer sliced from the nitrogen-doped CZ silicon crystal ingot is vacancy dominated and further wherein thermally treated at 780° C. for 3 hours and then at 1000° C. for 16 hours is characterized by:
   (1) an edge band in a region extending from about 1000 μm to the edge of said wafer and to the edge of said wafer wherein the edge band comprises oxygen precipitates having an average diameter of from about 30 nm to about 100 nm and an oxygen precipitation density of from about $1*10^8$ atoms per $cm^3$ to about $1*10^{10}$ atoms per $cm^3$,
   (2) an increase in radial bulk micro defect size in a region extending from the center of said wafer to the edge of said wafer of less than about 20%, or
   (3) an increase in radial bulk micro defect density in a region extending from the center of said wafer to the edge of said wafer of less than about 200%.

2. The method of claim 1 wherein the pull rate is from about 1.1 mm per minute to about 1.5 mm per minute.

3. The method of claim 1 wherein the nitrogen-doped CZ silicon crystal ingot has a surface temperature gradient of from about 10° K per cm to about 25° K per cm at an average crystal surface temperature of from about 1300° C. to about 1415° C.

4. The method of claim 1 wherein said wafer is characterized by an increase in radial bulk micro defect size in a region extending from about 10 mm to the edge of said wafer and to the edge of said wafer of less than about 15%.

5. The method of claim 1 wherein said wafer is characterized by an increase in radial bulk micro defect density in a region extending from about 10 mm to the edge of said wafer to the edge of said wafer of less than about 100%.

6. The method of claim 1 wherein the edge band comprises oxygen precipitates having an average diameter of from about 80 nm to about 90 nm and an oxygen precipitation density of from about $1*10^8$ atoms per $cm^3$ to about $1*10^{10}$ atoms per $cm^3$.

7. The method of claim 1 wherein the edge band comprises voids having an average radius of from about 1 nm to about 50 nm.

8. The method of claim 1 wherein the nitrogen-doped CZ silicon crystal ingot has a diameter of about 300 mm.

9. The method of claim 1 wherein the nitrogen concentration is from about $3*10^{13}$ nitrogen atoms per $cm^3$ to about $2*10^{14}$ nitrogen atoms per $cm^3$.

10. The method of claim 1 wherein the nitrogen concentration is from about $1*10^{14}$ nitrogen atoms per $cm^3$ to about $1*10^{15}$ nitrogen atoms per $cm^3$.

* * * * *